United States Patent
Wang et al.

(10) Patent No.: US 8,866,121 B2
(45) Date of Patent: Oct. 21, 2014

(54) CURRENT-LIMITING LAYER AND A CURRENT-REDUCING LAYER IN A MEMORY DEVICE

(75) Inventors: Yun Wang, San Jose, CA (US); Tony P. Chiang, Campbell, CA (US); Imran Hashim, Saratoga, CA (US)

(73) Assignees: SanDisk 3D LLC, Milpitas, CA (US); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/399,530

(22) Filed: Feb. 17, 2012

(65) Prior Publication Data

US 2013/0026438 A1 Jan. 31, 2013

Related U.S. Application Data

(63) Continuation-in-part of application No. 13/228,744, filed on Sep. 9, 2011, and a continuation-in-part of application No. 13/353,000, filed on Jan. 18, 2012.

(60) Provisional application No. 61/513,355, filed on Jul. 29, 2011.

(51) Int. Cl.
| | |
|---|---|
| H01L 47/00 | (2006.01) |
| H01L 29/02 | (2006.01) |
| H01L 29/04 | (2006.01) |
| G11C 13/00 | (2006.01) |
| H01L 45/00 | (2006.01) |
| H01L 27/24 | (2006.01) |
| G11C 11/00 | (2006.01) |

(52) U.S. Cl.
CPC ............... *H01L 45/08* (2013.01); *G11C 13/00* (2013.01); *H01L 45/1641* (2013.01); *H01L 45/12* (2013.01); *H01L 27/2409* (2013.01); *H01L 45/1233* (2013.01); *H01L 27/2463* (2013.01); *H01L 45/146* (2013.01); *G11C 11/00* (2013.01); *H01L 45/1616* (2013.01)
USPC ........................................ 257/4; 257/2; 257/3

(58) Field of Classification Search
CPC ....... H01L 45/146; H01L 45/08; H01L 45/12; H01L 45/1616; H01L 45/1641; H01L 27/2463
USPC ................................................ 257/4; 438/478
See application file for complete search history.

(56) References Cited

U.S. PATENT DOCUMENTS

| | | | |
|---|---|---|---|
| 5,311,039 A | 5/1994 | Kimura et al. | |
| 5,373,169 A | 12/1994 | McCollum et al. | |

(Continued)

FOREIGN PATENT DOCUMENTS

| | | |
|---|---|---|
| JP | 08-316324 | 11/1996 |
| JP | 2005-123575 | 5/2005 |
| WO | WO2005124787 | 12/2005 |

OTHER PUBLICATIONS

Muller et al., "Device Electronics for Integrated Circuits, Second Edition", John Wiley & Sons, Inc., (1986), 192-200.

(Continued)

*Primary Examiner* — Long K Tran
*Assistant Examiner* — Dzung Tran
(74) *Attorney, Agent, or Firm* — Vierra Magen Marcus LLP

(57) ABSTRACT

A current-limiting layer and a current-reducing layer are incorporated into a resistive switching memory device to form memory arrays. The incorporated current-limiting layer reduces the occurrence of current spikes during the programming of the resistive switching memory device and the incorporated current-reducing layer minimizes the overall current levels that can flow through the resistive switching memory device. Together, the two incorporated layers help improve device performance and lifetime.

17 Claims, 7 Drawing Sheets

(56) References Cited

U.S. PATENT DOCUMENTS

| | | |
|---|---|---|
| 5,379,250 A | 1/1995 | Harshfield |
| 5,475,253 A | 12/1995 | Look et al. |
| 5,486,707 A | 1/1996 | Look et al. |
| 5,818,749 A | 10/1998 | Harshfield |
| 5,915,167 A | 6/1999 | Leedy |
| 6,034,882 A | 3/2000 | Johnson et al. |
| 6,100,120 A | 8/2000 | Yu |
| 6,306,715 B1 | 10/2001 | Chan et al. |
| 6,342,414 B1 | 1/2002 | Xiang et al. |
| 6,351,406 B1 | 2/2002 | Johnson et al. |
| 6,369,421 B1 | 4/2002 | Xiang et al. |
| 6,376,787 B1 | 4/2002 | Martin et al. |
| 6,403,434 B1 | 6/2002 | Yu |
| 6,420,215 B1 | 7/2002 | Knall et al. |
| 6,426,891 B1 | 7/2002 | Katori |
| 6,434,060 B1 | 8/2002 | Tran et al. |
| 6,451,641 B1 | 9/2002 | Halliyal et al. |
| 6,451,647 B1 | 9/2002 | Yang et al. |
| 6,455,424 B1 | 9/2002 | McTeer et al. |
| 6,456,524 B1 | 9/2002 | Perner et al. |
| 6,465,804 B1 | 10/2002 | Shamir |
| 6,475,874 B2 | 11/2002 | Xiang et al. |
| 6,483,734 B1 | 11/2002 | Sharma et al. |
| 6,486,065 B2 | 11/2002 | Vyvoda et al. |
| 6,490,218 B1 | 12/2002 | Vyvoda et al. |
| 6,492,241 B1 | 12/2002 | Rhodes et al. |
| 6,495,437 B1 | 12/2002 | Yu |
| 6,514,808 B1 | 2/2003 | Samavedam et al. |
| 6,515,888 B2 | 2/2003 | Johnson et al. |
| 6,525,953 B1 | 2/2003 | Johnson |
| 6,534,403 B2 | 3/2003 | Cleeves |
| 6,534,841 B1 | 3/2003 | Van Brocklin et al. |
| 6,549,447 B1 | 4/2003 | Fricke et al. |
| 6,551,885 B1 | 4/2003 | Yu |
| 6,552,409 B2 | 4/2003 | Taussig et al. |
| 6,559,014 B1 | 5/2003 | Jeon |
| 6,574,145 B2 | 6/2003 | Kleveland et al. |
| 6,579,760 B1 | 6/2003 | Lung |
| 6,580,115 B2 | 6/2003 | Agarwal |
| 6,586,349 B1 | 7/2003 | Jeon et al. |
| 6,587,394 B2 | 7/2003 | Hogan |
| 6,617,639 B1 | 9/2003 | Wang et al. |
| 6,661,691 B2 | 12/2003 | Fricke et al. |
| 6,686,646 B2 | 2/2004 | Lee |
| 6,689,644 B2 | 2/2004 | Johnson |
| 6,690,597 B1 | 2/2004 | Perlov et al. |
| 6,704,235 B2 | 3/2004 | Knall et al. |
| 6,750,079 B2 | 6/2004 | Lowrey |
| 6,753,561 B1 | 6/2004 | Rinerson et al. |
| 6,784,517 B2 | 8/2004 | Kleveland et al. |
| 6,816,410 B2 | 11/2004 | Kleveland et al. |
| 6,822,888 B2 | 11/2004 | Peng |
| 6,842,369 B2 | 1/2005 | Koll et al. |
| 6,879,505 B2 | 4/2005 | Scheuerlein |
| 6,906,361 B2 | 6/2005 | Zhang |
| 6,937,507 B2 | 8/2005 | Chen |
| 6,937,509 B2 | 8/2005 | Perner et al. |
| 6,937,528 B2 | 8/2005 | Hush et al. |
| 6,952,030 B2 | 10/2005 | Herner et al. |
| 7,009,694 B2 | 3/2006 | Hart et al. |
| 7,012,297 B2 | 3/2006 | Bhattacharyya |
| 7,052,941 B2 | 5/2006 | Lee |
| 7,172,840 B2 | 2/2007 | Chen |
| 7,176,064 B2 | 2/2007 | Herner et al. |
| 7,206,214 B2 | 4/2007 | Hoefler et al. |
| 7,271,081 B2 | 9/2007 | Li et al. |
| 7,303,971 B2 | 12/2007 | Hsu et al. |
| 7,304,888 B2 | 12/2007 | Knall |
| 7,405,465 B2 | 7/2008 | Herner |
| 7,410,838 B2 | 8/2008 | Ang |
| 7,453,755 B2 | 11/2008 | Cleeves |
| 7,575,984 B2 | 8/2009 | Radigan et al. |
| 7,608,514 B2 | 10/2009 | Hsu |
| 7,629,198 B2 | 12/2009 | Kumar et al. |
| 7,633,108 B2 | 12/2009 | Li et al. |
| 7,649,768 B2 | 1/2010 | Hirose |
| 7,706,169 B2 | 4/2010 | Kumar |
| 7,863,598 B2 | 1/2011 | Sugita et al. |
| 7,875,871 B2 | 1/2011 | Kumar |
| 7,920,408 B2 | 4/2011 | Azuma et al. |
| 7,968,419 B2 | 6/2011 | Li et al. |
| 8,058,636 B2 | 11/2011 | Osano et al. |
| 8,072,795 B1 | 12/2011 | Wang et al. |
| 8,093,682 B2 | 1/2012 | Hirose |
| 8,148,711 B2 | 4/2012 | Fujii et al. |
| 8,183,553 B2 | 5/2012 | Phatak et al. |
| 8,279,657 B2 | 10/2012 | Takagi et al. |
| 8,339,834 B2 | 12/2012 | Nakai et al. |
| 8,343,813 B2 | 1/2013 | Kuse et al. |
| 8,410,467 B2 | 4/2013 | Wada |
| 8,558,208 B2 | 10/2013 | Fujitsuka et al. |
| 8,592,798 B2 | 11/2013 | Mikawa et al. |
| 2002/0019039 A1 | 2/2002 | Davis et al. |
| 2002/0070754 A1 | 6/2002 | Lambertson |
| 2002/0086476 A1 | 7/2002 | Kim et al. |
| 2003/0026158 A1 | 2/2003 | Knall et al. |
| 2003/0062595 A1 | 4/2003 | Anthony |
| 2003/0081445 A1 | 5/2003 | Van Brocklin et al. |
| 2003/0169625 A1 | 9/2003 | Hush et al. |
| 2004/0002184 A1 | 1/2004 | Cleeves |
| 2004/0016991 A1 | 1/2004 | Johnson et al. |
| 2004/0108573 A1 | 6/2004 | Herner et al. |
| 2004/0183144 A1 | 9/2004 | Beaman et al. |
| 2004/0245547 A1 | 12/2004 | Stipe |
| 2005/0014322 A1 | 1/2005 | Herner et al. |
| 2005/0026334 A1 | 2/2005 | Knall |
| 2005/0052915 A1 | 3/2005 | Herner et al. |
| 2005/0098800 A1 | 5/2005 | Herner et al. |
| 2005/0121742 A1 | 6/2005 | Petti et al. |
| 2005/0121743 A1 | 6/2005 | Herner |
| 2005/0124116 A1 | 6/2005 | Hsu |
| 2005/0221200 A1 | 10/2005 | Chen |
| 2005/0226067 A1 | 10/2005 | Herner et al. |
| 2006/0073642 A1 | 4/2006 | Yeh et al. |
| 2006/0076549 A1* | 4/2006 | Ufert ................. 257/3 |
| 2006/0171200 A1 | 8/2006 | Rinerson et al. |
| 2006/0197115 A1 | 9/2006 | Toda |
| 2006/0197180 A1 | 9/2006 | Lai et al. |
| 2006/0203541 A1 | 9/2006 | Toda |
| 2006/0249753 A1 | 11/2006 | Herner et al. |
| 2006/0250837 A1 | 11/2006 | Herner et al. |
| 2006/0252281 A1 | 11/2006 | Park et al. |
| 2006/0268594 A1 | 11/2006 | Toda |
| 2006/0273298 A1 | 12/2006 | Petti et al. |
| 2007/0008773 A1 | 1/2007 | Scheuerlein |
| 2007/0015330 A1 | 1/2007 | Li et al. |
| 2007/0015348 A1 | 1/2007 | Hsu et al. |
| 2007/0069241 A1 | 3/2007 | Yang et al. |
| 2007/0072360 A1 | 3/2007 | Kumar et al. |
| 2007/0087508 A1 | 4/2007 | Herner |
| 2007/0190722 A1 | 8/2007 | Herner |
| 2007/0228414 A1 | 10/2007 | Kumar et al. |
| 2007/0228442 A1 | 10/2007 | Kakimoto |
| 2008/0025078 A1 | 1/2008 | Scheuerlein et al. |
| 2008/0090337 A1* | 4/2008 | Williams ................. 438/133 |
| 2008/0128853 A1 | 6/2008 | Choi et al. |
| 2008/0219039 A1 | 9/2008 | Kumar et al. |
| 2008/0239790 A1 | 10/2008 | Herner et al. |
| 2009/0003036 A1 | 1/2009 | Kumar |
| 2009/0026434 A1* | 1/2009 | Malhotra et al. .................. 257/2 |
| 2009/0085154 A1 | 4/2009 | Herner et al. |
| 2009/0086521 A1 | 4/2009 | Herner et al. |
| 2009/0101965 A1 | 4/2009 | Chen et al. |
| 2009/0168492 A1 | 7/2009 | Thorp et al. |
| 2009/0227067 A1 | 9/2009 | Kumar et al. |
| 2009/0256130 A1 | 10/2009 | Schricker |
| 2009/0257270 A1 | 10/2009 | Schricker et al. |
| 2009/0272959 A1* | 11/2009 | Phatak et al. ................. 257/2 |
| 2009/0272961 A1* | 11/2009 | Miller et al. ................ 257/4 |
| 2009/0272962 A1* | 11/2009 | Kumar et al. ................. 257/4 |
| 2009/0283736 A1 | 11/2009 | Kanzawa et al. |
| 2010/0072451 A1 | 3/2010 | Terao et al. |
| 2010/0085794 A1 | 4/2010 | Chen et al. |
| 2010/0265750 A1 | 10/2010 | Yan et al. |

(56) References Cited

U.S. PATENT DOCUMENTS

| | | | |
|---|---|---|---|
| 2011/0002154 | A1 | 1/2011 | Mitani et al. |
| 2011/0037043 | A1 | 2/2011 | Wada |
| 2011/0062557 | A1 | 3/2011 | Bandyopadhyay et al. |
| 2011/0069532 | A1 | 3/2011 | Ichihara et al. |
| 2011/0085370 | A1 | 4/2011 | Chen et al. |
| 2011/0089391 | A1 | 4/2011 | Mihnea et al. |
| 2011/0140762 | A1 | 6/2011 | Jiang et al. |
| 2011/0149634 | A1* | 6/2011 | Schloss et al. ........... 365/148 |
| 2011/0194329 | A1 | 8/2011 | Ohba et al. |
| 2011/0310653 | A1 | 12/2011 | Kreupl |
| 2011/0310654 | A1 | 12/2011 | Kreupl |
| 2011/0310655 | A1 | 12/2011 | Kreupl |
| 2011/0310656 | A1 | 12/2011 | Kreupl |
| 2012/0018695 | A1 | 1/2012 | Lee et al. |
| 2012/0025164 | A1 | 2/2012 | Deweerd et al. |
| 2012/0091419 | A1 | 4/2012 | Chen et al. |
| 2012/0091427 | A1 | 4/2012 | Chen et al. |
| 2012/0170353 | A1 | 7/2012 | Iijima et al. |
| 2012/0193600 | A1 | 8/2012 | Himeno et al. |
| 2012/0295413 | A1 | 11/2012 | Fujii et al. |
| 2012/0313063 | A1 | 12/2012 | Wang et al. |
| 2012/0313069 | A1 | 12/2012 | Wang et al. |
| 2013/0028003 | A1 | 1/2013 | Wang et al. |
| 2013/0056700 | A1 | 3/2013 | Wang et al. |
| 2013/0065377 | A1 | 3/2013 | Gopal et al. |
| 2013/0140512 | A1 | 6/2013 | Chen et al. |
| 2013/0140514 | A1 | 6/2013 | Mikawa et al. |
| 2013/0148404 | A1 | 6/2013 | Bandyopadhyay et al. |

OTHER PUBLICATIONS

Li et al., Evaluation of SiO2 Antifuse in a 3D-OTP Memory, IEEE Transactions on Device and Materials Reliability, vol. 4, No. 3, Sep. 2004, pp. 416-421.
Herner et al., "Vertical p-i-n Polysilicon Diode With Antifuse for Stackable Field-Programmable ROM," IEEE Electron Device Letters, vol. 25, No. 5, May 2004, pp. 271-273.
Herner et al., "Polycrystalline silicon/CoSi2 Schottky diode with integrated SiO2 antifuse: a nonvolatile memory cell," Applied Physics Letters, vol. 82, No. 23, 2004, 4163-4165.
McPherson et al., "Proposed Universal Relationship Between Dielectric Breakdown and Dielectric Constant," IEEE International Electron Devices Meeting, 2002, pp. 26.6.1-26.6.4.
McPherson et al., "Trends in the Ultimate Breakdown Strength of High Dielectric-Constant Materials", IEEE Transactions on Electron Devices, vol. 50, No. 8, (Aug. 2003), 1771-1778.
King, et al., "Punchthrough Diode as the Transient Voltage Suppressor for Low-Voltage Electronics", Nov. 1, 1996, 4 pages, vol. 43, No. 11, IEEE Transactions on Electron Devices, IEEE Service Center, Piscataway, NJ, USA.
Chen et al. U.S. Appl. No. 13/465,263, filed May 7, 2012.
Herner et al., "Vertical p-i-n Polysilicon Memory Switching: Electrothermal-Induced Order," IEEE Trans. Electron Devices, 53.9, pp. 2320-2327, Sep. 2006.
Bandyopadhyay et al., U.S. Appl. No. 13/780,089, filed Feb. 28, 2013.
Tendulkar et al., U.S. Appl. No. 13/354,006, filed Jan. 19, 2012.
Tendulkar et al., U.S. Appl. No. 13/399,815, filed Feb. 17, 2012.
Meyer, R., et al. "Oxide Dual-Layer Memory Element for Scalable Non-Volatile Cross-Point Memory, Technology", 9th Annual, Non-Volatile Memory Technology Symposium, Nov. 11-14, 2008, pp. 54-58.
L.M. Levinson, "Electronic Ceramics: Properties, Devices, and Applications," (1988), p. 293.
Phatak et al., U.S. Appl. No. 13/189,065, filed Oct. 6, 2011.
Office Action of U.S. Appl. No. 13/353,000 mailed May 14, 2013.
Guo, X. et al.; "Tunneling Leakage Current in Oxynitride: Dependence on Oxygen/Nitrogen Content," Yale University (New Haven, CT); IEEE Electron Device Letters vol. 19, No. 6, Jun. 1998, pp. 207-209.
Jun. 17, 2013 Reply to May 14, 2013 Office Action of U.S. Appl. No. 13/353,000.
U.S. Appl. No. 14/176,882, filed Feb. 10, 2014.
U.S. Appl. No. 14/183,816, filed Feb. 19, 2014.
Office Action dated Feb. 21, 2014 in U.S. Appl. No. 13/228,744.
Office Action dated Feb. 27, 2014 in U.S. Appl. No. 13/465,263.
Final Office Action dated Mar. 6, 2014 in U.S. Appl. No. 13/314,580.
Nardi, F. et al., "Control of Filament Size and Reduction of Reset Current Below 10 uA in NiO Resistance Switching Memories," Academia—Politecnico di Milano; Solid-State Electronics 58, 2011 pp. 42-47.
Tirano, S. et al., "Accurate Analysis of Parasitic Current Overshoot During Forming Operation in RRAMs," CEA-LETI, France; Microelectronic Engineering 88, 2011, pp. 1129-1132.
Hierber, K., "Amorphous Chromium-Silicon: A Material for Kilo-Ohm Sheet Resistances," Siemens Aktiengesellschaft, Thin Solid Films, 57 (1979), pp. 353-357.
Wang, J. et al., "Thin Film Embedded Resistors," Gould Electronics, 6 pages, Pro. IPC Expo, Apr. 2001.
Chen, C. et al., "Nitrogen Implanted Polysilicon Resistor for High-Voltage CMOS Technology Application," Academia—National Cheng Kung University, Taiwan; IEEE Electron Device Letters vol. 22 No. 11; Nov. 2011, pp. 524-526.
Chen, A., "Current Overshoot During Set and Reset Operations of Resistive Switching Memories," IEEE; 2012, pp. MY2.1-MY2.4.
Nardi, F. et al., "Reset Current Reduction and Set-Reset Instabilities in Unipolar NiO RRAM," IEEE, 2011, 4 pages.
Final Office Action dated Oct. 24, 2013 in U.S. Appl. No. 13/465,263.
U.S. Appl. No. 14/075,036, filed Nov. 8, 2013.
Notice of Allowance and Fee(s) Due dated Nov. 20, 2013 in U.S. Appl. No. 13/354,006.
Notice of Allowance and Fee(s) Due dated Nov. 4, 2013 in U.S. Appl. No. 13/399,815.
Notice of Allowance and Fee(s) Due dated Nov. 1, 2013 in U.S. Appl. No. 13/353,000.
Response to Office Action filed Dec. 12, 2013 in U.S. Appl. No. 13/314,580.
U.S. Appl. No. 14/133,107, filed Dec. 18, 2013.
Restriction Requirement dated Jan. 16, 2014 in U.S. Appl. No. 13/228,744.
Response to Restriction Requirement filed Jan. 28, 2014 in U.S. Appl. No. 13/228,744.
Response to Office Action filed Jan. 27, 2014 in U.S. Appl. No. 13/465,263.
Notice of Allowance and Fee(s) Due dated Aug. 5, 2013 in U.S. Appl. No. 13/399,815.
Notice of Allowance and Fee(s) Due dated Sep. 4, 2013 in U.S. Appl. No. 13/309,813.
Notice of Allowance and Fee(s) Due dated Sep. 16, 2013 in U.S. Appl. No. 13/354,006.
Office Action dated Sep. 12, 2013 in U.S. Appl. No. 13/314,580.
Notice of Allowance and Fee(s) Due dated Oct. 8, 2013 in U.S. Appl. No. 13/309,813.
Notice of Allowance and Fee(s) Due dated Oct. 17, 2013 in U.S. Appl. No. 13/223,950.
Office Action dated Apr. 11, 2014 in U.S. Appl. No. 14/176,882.
Office Action dated Apr. 24, 2014 in U.S. Appl. No. 14/183,816.
Response to Final Office Action filed Apr. 25, 2014 in U.S. Appl. No. 13/314,580.
Advisory Action dated May 12, 2014 in U.S. Appl. No. 13/314,580.
Office Action dated Jun. 4, 2014 in U.S. Appl. No. 14/133,107.
Office Action dated Jun. 25, 2014 in U.S. Appl. No. 14/075,036.
Response to Office Action filed Jul. 22, 2014 in U.S. Appl. No. 14/183,816.
Notice of Allowance and Fee(s) Due dated Jul. 24, 2014 in U.S. Appl. No. 14/176,882,
International Search Report and Written Opinion dated Jul. 3, 2014 in International Patent Application No. PCT/US2014/018123.
Communication pursuant to Rules 161(2) an 162 EPC dated Aug. 6, 2014 in European Patent No. 112853845.1.
U.S. Appl. No. 14/458,295, filed Aug. 13, 2014.
Response to Office Action filed Sep. 4, 2014 in U.S. Appl. No. 14/133,107.

* cited by examiner

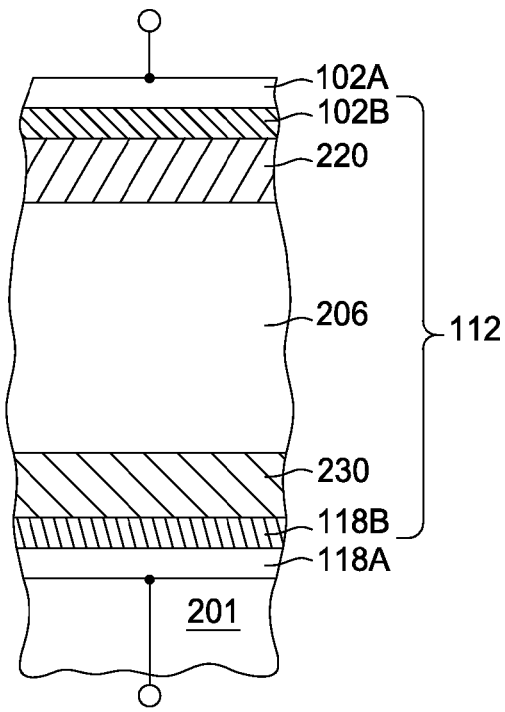
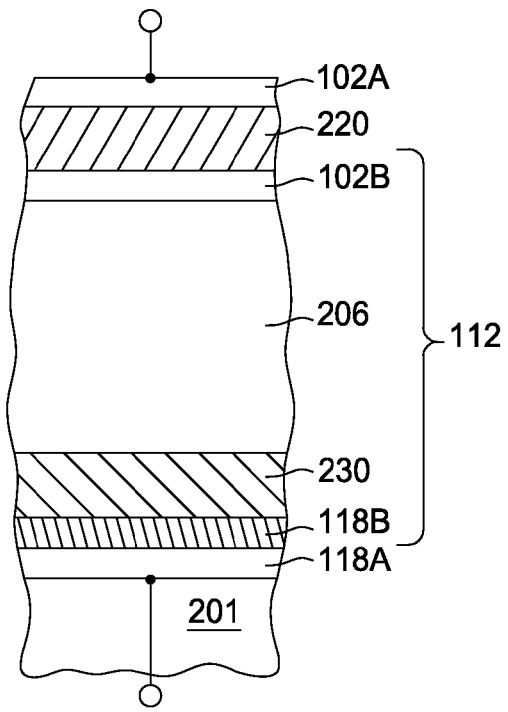
FIG. 3A    FIG. 3B
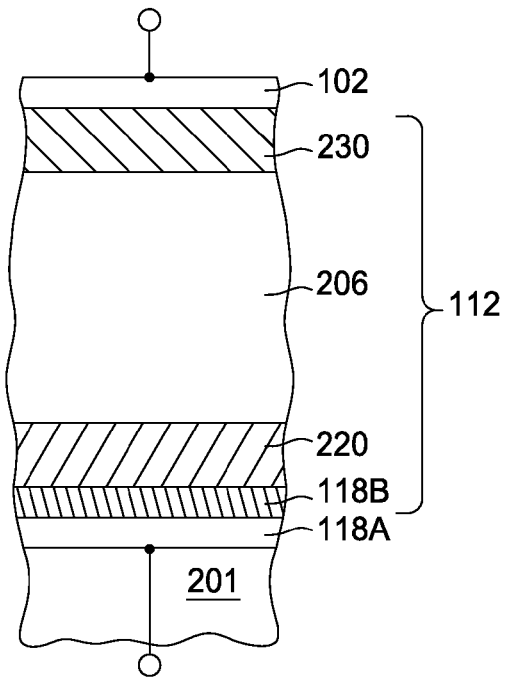
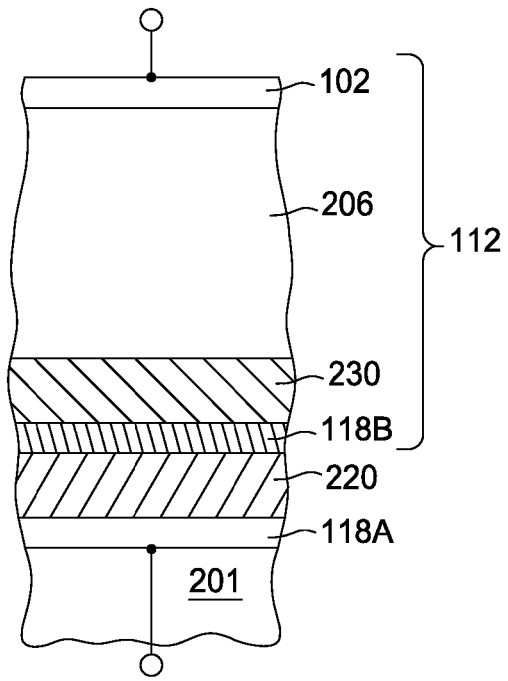
FIG. 3C    FIG. 3D ial storage is required. For example, nonvolatile memory cards are used in digital cameras to store images and in digital music players to store audio data. Nonvolatile memory devices are also used to persistently store data in computer environments.

CURRENT-LIMITING LAYER AND A CURRENT-REDUCING LAYER IN A MEMORY DEVICE

CROSS-REFERENCE TO RELATED APPLICATIONS

This application is a continuation-in-part of co-pending U.S. patent application Ser. No. 13/228,744, filed Sep. 9, 2011, and a continuation-in-part of co-pending U.S. patent application Ser. No. 13/353,000, filed Jan. 18, 2012, which claims benefit of U.S. provisional patent application Ser. No. 61/513,355, filed Jul. 29, 2011. Each of the aforementioned related patent applications is herein incorporated by reference.

BACKGROUND OF THE INVENTION

1. Field of the Invention

This invention relates to the formation of resistive switching memory devices.

2. Description of the Related Art

Nonvolatile memory devices are used in systems in which persistent storage is required. For example, nonvolatile memory cards are used in digital cameras to store images and in digital music players to store audio data. Nonvolatile memory devices are also used to persistently store data in computer environments.

Electrically-erasable programmable read only memory (EEPROM) technology is often used to form and program nonvolatile memory devices. This type of nonvolatile memory contains floating gate transistors that can be selectively programmed or erased by application of suitable voltages to their terminals. As fabrication techniques improve, it is becoming possible to fabricate nonvolatile memory devices with increasingly smaller dimensions. However, as device dimensions shrink, scaling issues pose challenges for traditional nonvolatile memory technology. This has led to the investigation of other alternatives, including nonvolatile resistive switching memory technology.

Nonvolatile resistive switching memory device and system are formed using memory cells that have two or more stable resistances states. Voltage pulses are used to switch the resistive switching memory element from one resistance state to the other. For example, a bistable memory cell having a resistive switching memory element with two stable resistance states can be placed in a high resistance state or a low resistance state by applying suitable voltages or currents. Nondestructive read and write operations can be performed to ascertain the value of a data bit that is stored in a memory cell.

Resistive switching based on having a resistive switching memory element formed of transition metal oxide (MO) films within a memory cell has been demonstrated. A current steering element (typically a diode and/or resistor) can sometimes be integrated into a resistive switching memory element to direct current flow in a memory cell. Since the overall power that can be delivered to a circuit containing a series of connected memory cells with resistive switching memory elements and current steering elements is typically limited in most conventional nonvolatile memory devices (e.g., CMOS driven devices), it is desirable to form each of the resistive switching memory elements and current steering elements in the circuit so that the voltage-drop across each of these elements is small, and thus the overall resistance of the series of these connected elements does not cause the current to decrease to an undesirable level when a high voltage level (e.g., ~2-5 volts) is applied.

As the sizes of the nonvolatile memory device shrink, it is important to reduce the required currents and voltages that are necessary to reliably set, reset and/or determine the desired "On" and "Off" states of the memory device to minimize the overall power consumption of a memory chip as well as resistive heating of the devices within the memory chip and cross-talk between adjacent memory devices. Moreover, it becomes increasing necessary to assure that the "set" and "reset" currents used to change the resistance state of the resistive switching memory element are not too large to alter the electrical or physical properties of the one or more layers found in the interconnected memory devices. A large current flowing through the current carrying lines in a memory array can also undesirably alter or disturb the "logic" state of the interconnected memory cells/devices or possibly damage portions of the adjacently connected memory devices, due to an appreciable amount of "cross-talk" between the formed devices.

Thus, there is a need to limit and/or minimize the required current used to sense and program the logic states of each of the interconnected memory devices, in an effort to reduce chip overall power consumption as well as improve device longevity and reduce the chance that cross-talk between adjacently connected devices. Therefore, it is desirable to form a nonvolatile memory device with a current-limiting material layer and a current-reducing material layer to minimize programming currents used when switching the device between the "on" and "off" states.

SUMMARY OF THE INVENTION

Embodiments of the invention generally include a method of forming a ReRAM type nonvolatile memory device. The ReRAM type switching memory device includes at least one current-limiting layer and at least one current-reducing layer integrated within or adjacent to a ReRAM type nonvolatile memory element. The ReRAM type switching memory element may include a first electrode layer, a second electrode layer, and a variable resistance layer disposed between the first electrode layer and the second electrode layer. In addition, the current-limiting layer and the current-reducing layer can be incorporated into a number of resistive switching memory devices within a memory array to help reduce the level of current flowing therein and minimize the memory array's overall power consumption.

In one embodiment, the current-limiting layer is incorporated between the variable resistance layer and at least one of a first electrode layer and a second electrode layer. The incorporated current-limiting layer reduces the magnitude of current spikes that are usually observed during the programming of the resistive switching memory device.

In another embodiment, the current-reducing layer is incorporated adjacent the variable resistance layer. In yet another embodiment, the current-reducing layer is formed into a portion of the variable resistance layer. The incorporated current-reducing layer minimizes the overall current levels that can flow through the resistive switching memory device.

In still another embodiment, the invention provides a method of forming a nonvolatile memory device including depositing a first electrode layer, a second electrode layer, and a variable resistance layer between the first electrode layer and the second electrode layer over a surface of a substrate. The method further includes depositing a current-reducing layer adjacent the variable resistance layer and depositing a current-limiting layer between the variable resistance layer and at least one of the first electrode layer and the second electrode layer.

In yet another embodiment, a method of forming a nonvolatile memory device having a nonvolatile memory element includes depositing a first electrode layer, a second electrode layer, and a variable resistance layer between the first electrode layer and the second electrode layer over a surface of a substrate, forming a current-reducing layer into a portion of the variable resistance layer, and depositing a current-limiting layer between the variable resistance layer and at least one of the first electrode layer and the second electrode layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A is a schematic cross-sectional view of a current-limiting layer and a current-reducing layer disposed in a nonvolatile memory device in accordance with one embodiment of the invention.

FIG. 3B is a schematic cross-sectional view of a current-limiting layer and a current-reducing layer disposed in a nonvolatile memory device in accordance with another embodiment of the invention.

FIG. 3C is a schematic cross-sectional view of a current-limiting layer and a current-reducing layer disposed in a nonvolatile memory device in accordance with still another embodiment of the invention.

FIG. 3D is a schematic cross-sectional view of a current-limiting layer and a current-reducing layer disposed in a nonvolatile memory device in accordance with yet another embodiment of the invention.

DETAILED DESCRIPTION

Figure 1:
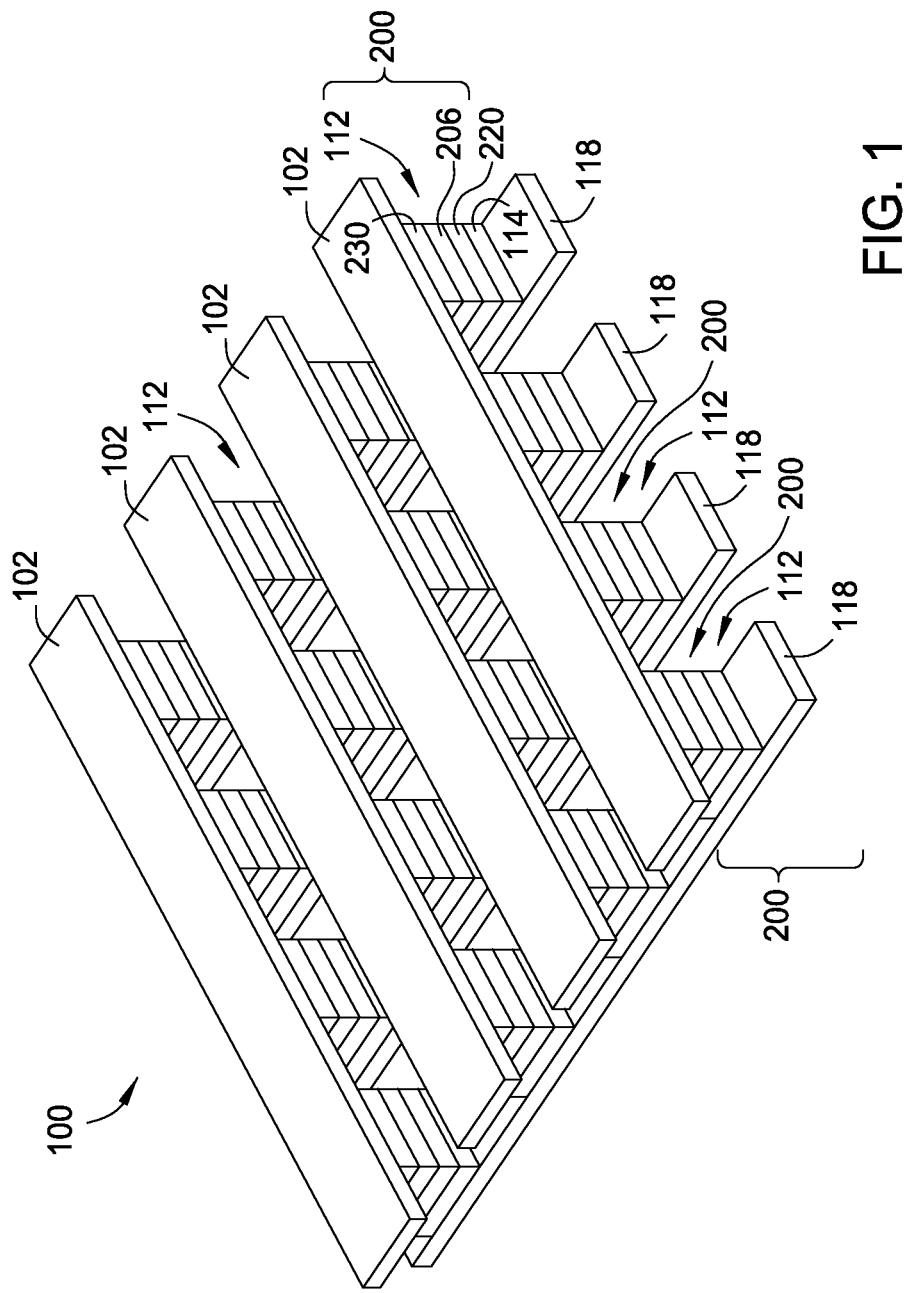
FIG. 1 illustrates an array of resistive switching memory devices in accordance with one embodiment of the invention.

Embodiments of the invention generally include a method of incorporating at least one current-limiting layer and at least one current-reducing layer into resistive switching memory devices disposed in an array of memory devices to eliminate undesirable current spikes, limit the current flowing within the memory device during device switching operations, and further reduce the overall current levels that can flow within the memory device, thus improving the device performance and increasing usable lifetime for each memory device.

In one embodiment, the current-limiting layer includes a resistor element which comprises one or more layers of a resistive material that has desirable electrical characteristics, such that currents flowing within the memory device are designed to be under a maximum device compliance level (e.g., less than a compliance current level ($I_{CC}$) as required by device specifications), thus limiting the chance of high current spikes to cause damage to the memory device. The current-limiting layer provides added resistance to the memory device, which is much larger than the combined resistance of other components within the memory device, such that currents flowing through the memory device during various device forming and switching operations are controlled by the presence of the resistance of the current-limiting layer (e.g., a maximum current level at device "On" state equals an applied voltage level divided by the resistance of the current-limiting layer).

In one aspect, the electrical properties of the current-limiting layer have a breakdown voltage that exceeds the breakdown voltage of the variable resistance layer, thereby reducing the occurrence of current spikes and limiting the magnitude of currents that can flow through the material layers of the nonvolatile memory device. The higher breakdown voltage of the current-limiting layer helps to maintain resistance in the memory device during the device electrical-forming stage and/or switching operations and, as a result, reduce the chance of damage to the memory device during high current switching operations. The effect of preventing device damage is due, in part, because it takes higher voltage levels to break down the materials within current-limiting layer, as compared to the materials typically used in a variable resistance layer. Stated another way, the current-limiting layer is capable of maintaining its resistance during various device forming and switching operations, thereby limiting current flows and reducing current spikes. In another aspect, the total electrical resistance of the current-limiting layer can be close to the electrical resistance of a current steering device of a ReRAM type switching memory device, such as between about 75% and about 125% of the resistance of the formed current steering element. It is found that the presence of the current-limiting layer having a resistance near the resistance of the current steering element enable the current-limiting layer to function together with the current steering element to enhance the switching performance in a memory device.

For example, the current-limiting layer may comprise a resistive material, such as a metal that has high resistivity, a doped semiconductor, and a conductive dielectric material, among others, so as to add a fixed series resistance in the formed nonvolatile memory element and limit the current flow through a variable resistance layer during the logic state programming steps (i.e., "set" and "reset" steps). One example of the suitable resistive material is a semiconductor material, for example, a polycrystalline silicon material (polysilicon). Other suitable materials include doped semiconductors, resistive metals, conductive dielectric materials, metal nitride materials, tantalum-containing materials, titanium-containing materials, silicon nitride, tantalum nitride, titanium nitride, hafnium nitride, germanium (Ge)-containing semiconductor materials, gallium arsenide, among others. The semiconductor material can be doped with a dopant, such as phosphorus (P), arsenic (As), antimony (Sb), boron (B), and aluminum (Al), among others.

In one aspect, the current-limiting layer acts as a resistive element that is connected with a formed resistive switching memory element of a resistive switching memory device to provide an additional resistance during normal device switching operations. In another aspect, the current-limiting layer is a resistive element that is disposed within a resistive switching memory element in a nonvolatile resistive switching memory device. The incorporation of a simple, less complex resistive element into a resistive switching memory device that is easy to fabricate so that less complex devices can be formed.

In another embodiment, the current-reducing layer is an interfacial resistive layer disposed adjacent a variable resistance layer of a nonvolatile memory element. The addition of the current-reducing layer near the variable resistance layer increases the total resistivity of the variable resistance layer and lowers the chance that large currents (e.g., $I_{SET}$, $I_{RESET}$, $I_{ON}$, and $I_{OFF}$) can flow through the variable resistance layer during device operation. The use of a current-reducing layer allows thinner layers to be used in the film stack of the nonvolatile memory element, resulting in desirably lower switching currents in a ReRAM type switching memory device. In forming the ReRAM type nonvolatile switching memory element, the addition of the current-reducing layer can be used to increase the barrier height at the interface between the variable resistance layer and electrode layers so as to reduce the current flowing through the resistive switching memory device. In one aspect, the current-reducing layer is an interfacial layer formed: 1) adjacent to the variable resistance layer of a resistive switching memory device by chemically treating the variable resistance layer and/or 2) adjacent to the electrode layer, so that the interfacial current-reducing layer can be formed between the variable resistance layer and the electrode layer. In another aspect, the current-reducing layer is formed into a portion of the variable resistance layer of a memory device by chemically treating the variable resistance layer or adding dopant atoms during the deposition of the variable resistance layer.

For example, the current-reducing layer may be formed by doping aluminum or zirconium during the deposition of the variable resistance layer. The current-reducing layer may also be formed by depositing an interfacial high-k material layer between the variable resistance layer and one or more electrode layers. Alternatively, the current-reducing layer may be formed by chemically treating one or more silicon oxide-containing electrode layers with a chemical oxidation solution or a buffered cleaning solution prior to or after the formation of the variable resistance layer during the fabrication of the nonvolatile memory element. In addition, the current-reducing layer may be formed by treating one or more silicon oxide-containing electrode layers with ozone or nitrogen prior to the formation of the variable resistance layer. The current-reducing layer may also be formed by treating a portion or the bulk of the variance resistance layer after the formation of the variable resistance layer.

The current-limiting layer and the current-reducing layer are integrated and both layers function together to improve the switching characteristics of the ReRAM nonvolatile memory element. On one hand, the electrical properties of the current-limiting layer have a breakdown voltage that exceeds the breakdown voltage of the variable resistance layer, thereby limiting the currents that can flow through the ReRAM nonvolatile memory element. In addition, the resistivity of the current-limiting layer material and/or the thickness of the current-limiting layer are adjusted so that the electrical resistance of the current-limiting layer is between about 75% and about 125% of the electrical resistance of the current steering device, when current is flowing from the first electrode to the second electrode through the formed nonvolatile memory element.

On the other hand, a silicon oxide containing layer is formed adjacent (below or above) the variable resistance layer to reduce the overall magnitude of current flowing through the switching memory device. Optionally, a high-k interfacial layer can be formed adjacent the variable resistance layer or into a portion of the variable resistance layer to serve as a current-reducing layer. The addition of the current-reducing layer can lower the magnitude of a current flow that can flow through the switching memory device during various device switching or programming operations and allow thinner layers to be used in the nonvolatile memory element, resulting in desirably lower switching currents and lower power consumption. It has been found that the current-limiting layer and the current-reducing layer can help minimize current spikes and high switching current levels during device operation and help improve device performance and lifetime.

The current-limiting layer and the current-reducing layer structure are incorporated into a nonvolatile memory device having a resistive switching memory element capable of switching between at least two or more stable resistance states, each with a different resistance. Each resistive switching memory device generally comprises an MIM (metal-insulator-metal) stack, wherein the insulator is a variable resistance layer that typically comprises a metal oxide material. The metal oxide insulator offers bistable resistance for the resistive switching memory device. A number of nonvolatile memory devices can be interconnected to form one or more memory arrays prior to being connected to at least one control circuitry, and ultimately, fabricated into a memory array formed on a memory chip. Nonvolatile resistive switching memory devices may be formed as part of a high-capacity nonvolatile memory integrated circuit, which can be used in various electronic devices, such as digital cameras, mobile telephones, handheld computers, and music players, among others.

Resistive Random Access Memory (RRAM or ReRAM) is often made by arranging a number of memory devices into cross point memory arrays in order to increase the density of the memory devices connected together in memory array formed on a memory chip. A current steering element, such as a diode, is often used to prevent cross-talk between the interconnected resistive switching memory devices from affecting the stored data in other interconnected memory devices within the memory array. The current steering element is configured to pass limited programming currents through the resistive switching memory element in desired directions.

Even though significant progress has been made to reduce the compliance current limit for a resistive switching memory device, the programming current levels for conventional memory devices are still much higher than required levels to cause the switching memory devices to switch. For example, a resistive switching memory device may require its maximum programming current be under a compliance current limit of less than 10 µA (microamps). Conventional resistive switching memory elements generally exhibit large magnitudes of current flowing therethrough, and most often encounter uncontrollable current spikes higher than desired switching programming currents (e.g., high current levels and current spikes as shown as current levels 510 and current levels 504, respectively, in FIG. 5A and described in detail below). It has been difficult to reduce the current levels and current spikes to below several tens of microamps so that they are under the compliance current ($I_{CC}$) limit. Previous solutions have used a single transistor in series with the memory element of the memory device, but this is generally not compatible with the architecture of crossbar memory arrays, since the transistors typically cannot be stacked vertically. In addition, such approaches require additional processing as well as additional interconnects to connect to the gate of the transistor.

Therefore, low switching currents can be achieved when uncontrolled current spikes are eliminated and the magnitudes of the overall currents flowing through the memory device are reduced during "switching" (SET and RESET) operations. In practice, it is very hard to prevent the current spikes and large currents from flowing through the memory devices due to the presence of parasitic capacitor-like elements found in the interconnected memory array. These parasitic capacitor-like elements are typically connected to the interconnected memory devices and coupled to the electrodes of the memory devices, and tend to induce large currents independent of any control device separated from the memory element.

Accordingly, one embodiment of the invention integrates and incorporates both a current-limiting layer and a current-reducing layer in a memory device to resolve these parasitic currents. The incorporation of the current-limiting layer in a memory device limits and/or minimizes the current spikes during sensing and programming the logic states for each of the interconnected memory devices, whereas the integration of the current-reducing layer further reduces the magnitude of the current flowing through each of the interconnected memory devices. Together, the two layers reduce overall current levels during device switching operations, reduce the memory chip's overall power consumption, improves device longevity, reduces the chance of cross-talk between adjacently connected memory devices, and thus minimizes the chance that cross-talk will alter the memory device's logic state. The current-limiting layer may be incorporated adjacent to the resistive switching memory element of a memory device, such as disposed "in series" with or "within" a portion of the resistive switching memory element. The current-reducing layer is incorporated to be adjacent to or within a portion of the variable resistance layer within a switching memory element of a memory device.

Another embodiment of the invention provides for the setting of the compliance current limit, $I_{CC}$ or $I_{MAX}$, at desirable switching currents levels that meet the device specification requirements. The current-limiting layer and the current-reducing layer are disposed within each switching memory device to control and reduce the maximum current flowing therethrough. In addition, the current-limiting layer and the current-reducing layer provided herein are designed to meet the cross-sectional requirements for dense flash memories. The current-limiting layer and the current-reducing layer are designed to be compatible with the use of a current steering element, which is typically a diode.

In addition, the current-limiting layer and the current-reducing layer are provided in memory devices having resistive switching memory elements and current steering elements such that the voltage-drop across each of these elements is small, and thus the overall resistance of the series of these connected elements does not cause the current to decrease to an undesirable level due to a fixed voltage (e.g., between 2 volts and 5 volts) applied to the memory circuit. Thus, the current-limiting layer and the current-reducing layer are provided herein to form a nonvolatile memory device so that low programming currents can be used to reliably switch the nonvolatile memory device between the "on" and "off" device states.

The electrical properties of the current-limiting layer and current-reducing layer are configured to lower the maximum current limit and the magnitude of the current that can flow through the variable resistance layer of the resistive switching memory element to prevent the transmitted current from damaging the memory device. This objective is obtained, in part, by providing added resistances in the formed nonvolatile resistive switching memory device, where the resistances are low at low voltage levels (e.g., the voltages applied during read operations) and the resistances are high at high voltage levels (e.g., the voltages applied at set, reset, and switching operations). It is generally desirable to form the current-limiting layer and the current-reducing layer so that their material and electrical properties do not degrade or breakdown during the often high current "burn-in" type device preparation steps, such as the "electrical forming" process, and also during normal repetitive set, reset, or switching operations of the nonvolatile resistive switching memory device.

In one embodiment, by careful selection of the materials used to form the material layers of the current-limiting layer and the current-reducing layer described herein, the maximum current limit, $I_{MAX}$, that is able to pass through the formed memory device is reduced so that the overall current levels used during normal device operation and during the "electrical forming" process will meet the specification requirement of device compliance current, $I_{CC}$. The careful selection of materials used will include the selection of the resistivity and thickness for each material layer, and the type and the concentration of the dopant for each material layer, among others. The material layers of the resistor structure are selected and formed, and the currents flowing through the memory device are measured. The resulting sense current measurements (by applying sensing pulses at a voltage level of $V_{READ}$) show that the measured current values during "read" or "sensing" operations are reduced to near $I_{ON}$ levels and are kept relatively stable (e.g., no current spikes) after applying high voltage levels applied during "set" or "switching" operations. The incorporation of the current-limiting layer and the current-reducing layer in a memory device allows the overall switching currents to be lower than conventional memory devices, and in turn, allows for a reduced overall operating power and the use of larger memory array sizes.

FIG. 1 illustrates one example of a memory array 100 in accordance with one embodiment of the invention. The memory array 100 may be part of a larger memory device, system or other integrated circuit structures, such as a memory chip type device. The memory array 100 includes a number of nonvolatile resistive switching memory devices, such as a memory device 200. In one aspect, the memory devices 200 can be spatially arranged as shown. Alternatively, the memory devices 200 can be arranged in other configurations. Each memory device 200 generally includes one or more conductive layers. The one or more conductive layers may include an electrode 102 and an electrode 118 disposed in the upper and lower side of the memory device 200. Each conductive layer has a desired function in the formed array of memory devices 200. The memory devices 200 can be accessed individually or in groups using appropriate sets of word-lines and bit-lines, conveniently formed by the electrodes 102 and 118.

Figure 2B:
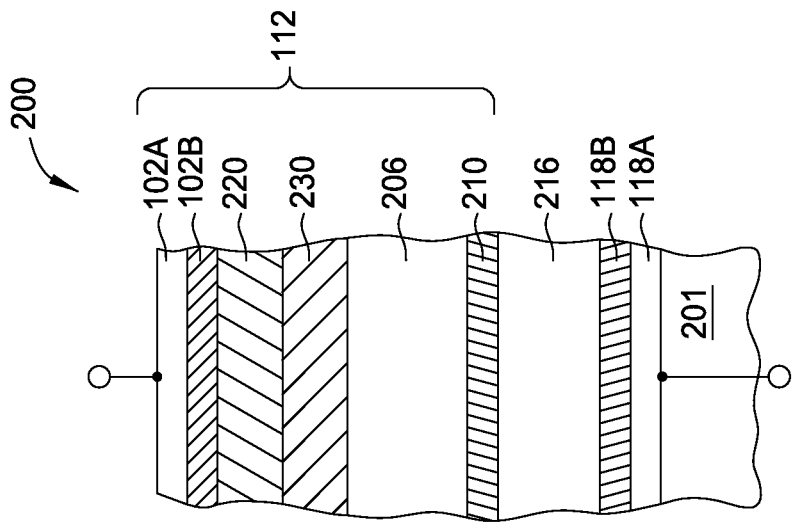
FIG. 2B is a schematic representation of a memory device having a diode type current steering element in accordance with another embodiment of the invention.

In one embodiment, the memory device 200 includes a current-limiting layer 220, a current-reducing layer 230, a variable resistance layer 206, and one or more material layers 114 to form into at least one resistive switching memory element 112. For example, the resistive switching memory element 112 may contain an MIM (metal-insulator-metal) stack, where an insulator material layer is stacked between two or more conductive metal material layers. The conductive metal material layers may be a top electrode layer (e.g., the electrodes 102), an intermediate electrode layer (e.g., an intermediate electrode layer 210 as shown in FIG. 2B), a bottom electrode layer (e.g., the electrode 118). The conductive metal material layers, such as the electrode 102, the intermediate electrode layer 210 and the electrode 118 are generally formed from a conductive material, such as a highly conductive semiconductor material (e.g., p-type polysilicon, n-type polysilicon) and/or a conductive metal material, e.g., titanium nitride (TiN), aluminum (Al), tungsten (W), among others, to minimize the circuit resistance created between the interconnected memory devices in the memory array 100. As an example, the insulator material layer may be stacked between the electrodes 102. 118, between the electrode 102 and an intermediate electrode layer 210, thus forming the MIM stack.

The variable resistance layer 206 may comprise a dielectric material, such as a metal oxide material or other similar material that can be switched between at least two or more stable resistance states. For example, the variable resistance layer 206 may contain a metal oxide material, such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$), among others. As another example, the variable resistance layer 206 may contain a metal nitride or metal silicate material, such as aluminum nitride ($Al_xN_y$), zirconium nitride ($Zr_xN_y$), silicon nitride ($Si_xN_y$), hafnium nitride ($Hf_xN_y$), aluminum oxynitride ($Al_xO_yN_z$), silicon oxynitride (SiON), hafnium oxynitride ($Hf_xO_yN_z$), hafnium silicon oxide ($Hf_xSi_yO_z$), zirconium silicon oxide ($Zr_xSi_yO_z$), hafnium silicon oxynitride (HfSiON), titanium silicon nitride (TiSiN), tantalum silicon nitride (TaSiN), among others. In addition, the one or more material layers 114 may contain a current steering element (e.g., a current steering element 216 as shown in FIG. 2B).

In another embodiment, the current-limiting layer 220 comprises a resistive metal material, a doped semiconductor material, and a conductive dielectric material. The current-limiting layer 220 may contain a polysilicon material, for example, an n-type semiconductor material, a p-type semiconductor material, a low bandgap semiconductor material (e.g., amorphous silicon, zinc oxide ($Zn_xO_y$), etc.). Various doped polysilicon materials can be used to form the current-limiting layer 220 by adjusting the concentrations of a dopant, such as phosphorus (P), arsenic (As), boron (B), aluminum (Al), etc. In one example, polysilicon is a suitable material since its resistivity can be modified by a suitable amount of doping, and it is a semiconductor material that can withstand high voltages and current densities. As another example, the current-limiting layer 220 can be an N-type resistor or a P-type resistor. As another example, the current-limiting layer 220 may contain a metal nitride material (e.g., silicon nitride ($Si_xN_{1-x}$), hafnium nitride ($Hf_xN_y$), tantalum nitride ($Ta_xN_y$), titanium nitride ($Ti_xN_y$), etc.), a ternary intermetallic material (e.g., tantalum silicon nitride ($Ta_xSi_yN_z$), titanium silicon nitride ($Ti_xSi_yN_z$), titanium aluminum nitride ($Ti_xAl_yN_z$), etc.), a ceramic metal alloy material (e.g., chromium silicon oxide ($Cr_xSi_yO_z$)), among others. In one example, the current-limiting layer 220 may be formed using an ALD, CVD or PVD type process. In another example, the current-limiting layer 220 comprises amorphous silicon, zinc oxide ($Zn_xO_y$), or chromium silicon oxide ($Cr_xSi_yO_z$) formed using a PVD process. The thickness of the current-limiting layer may be between 50 Å and 1000 Å.

In still another embodiment, the current-reducing layer 230 is comprised of an interfacial oxide-containing layer disposed between at least one of the electrode layers and the variable resistance layer 206. Alternatively, the current-reducing layer 230 is an oxide-containing layer formed into a portion of the variable resistance layer 206.

As an example, the current-reducing layer 230 may be a silicon oxide-containing layer formed by cleaning the surface of a silicon oxide-containing electrode layer (e.g., the electrode 210) with a buffered cleaning solution an/or chemically treating the silicon oxide-containing electrode layer with a chemical oxidation solution prior to or after the formation of the variable resistance layer during the fabrication of the nonvolatile memory element. In one example, the chemical cleaning solution may contain a mixture of ammonium hydroxide ($NH_4OH$), hydrogen peroxide ($H_2O_2$), and de-ionized (DI) water. As another example, the buffered cleaning solution may be an aqueous solution of hydrogen fluoride (HF) and deionized (DI) water and may contain between about 0.1% and about 10% weight of hydrogen fluoride (HF) that is maintained at a temperature between about 20° C. and about 3° C. As still another example, the buffered cleaning solution may be a buffered-oxide-etch (BOE) solution, such as a mixture of ammonium fluoride ($NH_4F$) and hydrofluoric acid (HF).

As another example, the current-reducing layer 230 is formed using a dry clean procedure in a plasma processing chamber. In this embodiment, the surface of a silicon-containing electrode layer may be exposed to a plasma comprised of ammonium ($NH_3$) and nitrogen trifluoride ($NF_3$) precursors to react with a native silicon oxide material found on the surface of the silicon-containing material layer (e.g., the electrode 102, 102B or the intermediate electrode layer 210) and form a high quality, thin silicon oxide-containing current-reducing layer thereon. The formed thin silicon oxide layer can be heated to a temperature of about 600° C. to about 800° C. for about 1 minute to about 10 minutes to improve the quality of the formed silicon oxide layer. As still another example, the current-reducing layer 230 may be a silicon oxide-containing layer formed by cleaning one or more silicon oxide-containing electrode layers with the wet cleaning solutions (e.g., the chemical oxidation solution and the buffered cleaning solution as described above) and treating the resulting cleaned silicon-oxide containing material layer with a plasma of ozone ($O_3$) or nitrogen ($N_2$), such as an ozone-containing plasma or a nitrogen-containing plasma, prior to or after the formation of the variable resistance layer 206.

As still another example, the current-reducing layer 230 may comprise a doped hafnium oxide layer formed by doping aluminum or zirconium into a portion of a hafnium oxide-containing variable resistance layer 206. For example, during the deposition of the variable resistance layer 206 over a surface of substrate, successive pulses of a dopant material (e.g., aluminum or zirconium) can be introduced during an ALD, CVD, or PVD deposition process prior to, or after, depositing the bulk of the hafnium oxide-containing variable resistance layer. The resulting doped metal oxide material layer region, which is formed into a portion of the bulk metal oxide containing variable resistance layer, serves as the current-reducing layer 230 to help reducing the programming current level flowing through a memory device thus formed.

The memory array 100 can be stacked in a vertical fashion or in other configurations to form various types of multilayered memory array structures. The use of the resistive switching memory elements 112, the current-limiting layer 220, the current-reducing layer 230, the variable resistance layer 206, and the one or more materials layers 114, to form memory arrays as shown in FIG. 1, is merely illustrative, and one skilled in the art would appreciate that the formed devices may be used in other device applications without deviating from the basic scope of the invention described herein.

Figure 2A:
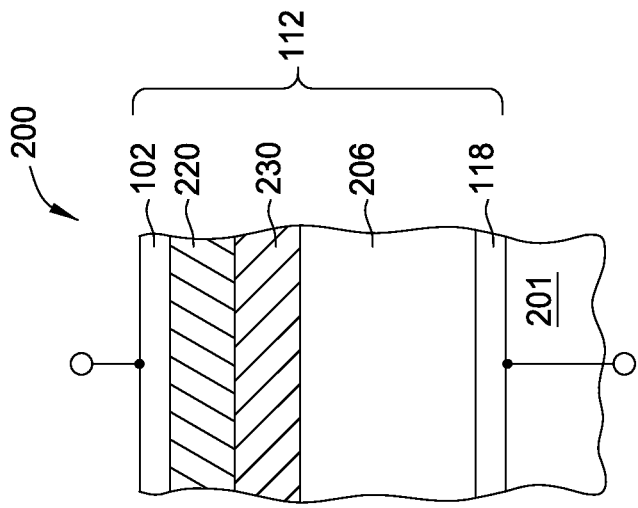
FIG. 2A is a schematic representation of a memory device in accordance with one embodiment of the invention.

FIGS. 2A and 2B illustrate two examples of the memory device 200. The memory device 200 includes the electrode 118 disposed over a surface of a substrate 201, a variable resistance layer 206 disposed over the surface of the electrode 118, a current-reducing layer 230 disposed adjacent the variable resistance layer 206, a current-limiting layer 220 disposed over the surface of the current-reducing layer 230 and an electrode 102 disposed over the surface of the current-limiting layer 220.

In one aspect, as shown in FIG. 2B, the electrodes 102 and 118 each include two or more conductive layers in which a first conductive layer (e.g., electrode layers 102A, 118A) is used to interconnect a number of the memory devices 200, and a second conductive layer (e.g., electrode layers 102B, 118B) is disposed in each memory device 200 to provide a desirable electrical interface (e.g., desirable work function) to the adjacent components in the memory device 200. In addition, an intermediate electrode layer 210, as shown in FIG. 2B, is disposed near the variable resistance layer 206 to provide a desirable electrical interface (e.g., desirable work function). For example, the intermediate electrode layer 210 can be provided as a metal layer for the MIM (metal-insulator-metal) stack of the resistive switching memory element 112.

The memory device 200, as shown in FIGS. 2A-2B, includes a resistive switching memory element 112 and, optionally, a current steering element 216 which allows current to flow through the memory device 200, preferentially in a forward direction ("I$^+$"). In one configuration, the current steering element 216 is an intervening electrical component, such as a p-n junction diode, p-i-n diode, transistor, or other similar device that is disposed between the bottom electrode layer 118 and the resistive switching memory element 112. Alternatively, the current steering element 216 can also be disposed between the top electrode layer 102 and the resistive switching memory element 112. For example, the current steering element 216 may include two or more layers of semiconductor material, such as two or more P-doped or N-doped silicon layers, configured to direct (e.g., allow or inhibit) the current flow through the memory device 200 in different directions during operation. In one example, the current steering element 216 is a diode that comprises a p-doped silicon layer (not shown), an un-doped intrinsic layer (not shown), and an n-doped silicon layer (not shown) that has an overall resistance between about 1 kΩ and about 100 MΩ. The overall resistance of the current steering element 216 generally depends on the type of current steering element 216 that is formed and in what direction current is flowing through the memory device 200 (e.g., forward or reversed biased). Alternatively, a high-capacity nonvolatile memory integrated circuit may contain a MOS-type transistor or other types of transistors to regulate current flow. Because of the design of the material layers within current steering element 216, a reduced current can also flow in the opposing direction through the memory device 200 by the application of a reverse bias to the electrodes 102 and 118.

The electrodes 102, 118, 102A, 102B, 118A, 118B and 210 disposed in the memory device 200, as shown in FIGS. 1, 2A-2B, are generally formed from a conductive material that has a desirable conductivity and work function. In some configurations, these electrodes may be formed from different materials, which may include, but are not limited to p-type polysilicon, n-type polysilicon, transition metals, transition metal alloys, transition metal nitrides, and transition metal carbides. In one example, the electrodes comprise a metal, metal alloy, metal nitride or metal carbide formed from an element selected from a group consisting of titanium (Ti), tantalum (Ta), tungsten (W), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combinations thereof. In one example, the electrodes 102, 118, 102A, 102B, 118A, 118B and 210 comprise a metal alloy selected from the group of a titanium/aluminum alloy, transition metal nitride (e.g., titanium nitride (TiN), tantalum nitride (TaN), or a silicon-doped aluminum (AlSi)). In another example, the electrodes 102, 118 may comprise a transition metal, transition metal alloy, transition metal carbide, transition metal nitride (e.g., titanium nitride (TiN), tantalum nitride (TaN)), and the intermediate electrode layer 210 comprises a heavily doped semiconductor material, such as a heavily doped silicon material (e.g., n-type polysilicon material) that interfaces well with the current steering element 216. For example, the intermediate electrode layer 210 may comprise a polysilicon material and is between about 50 and about 500 angstroms (Å) thick, and the electrodes 102, 118 are between about 50 Å and 5000 Å thick and comprise a conductive metal material, such as titanium nitride (TiN). The electrodes 102, 118, 102A, 102B, 118A, 118B and 210 can be formed over a surface of a substrate 201 by a deposition process, including CVD (e.g., LPCVD, PECVD), ALD (e.g., PEALD), physical vapor deposition (PVD), liquid deposition processes, ion implants, and epitaxial processes to a thickness from 50 Å to 500 Å.

Figure 2C:
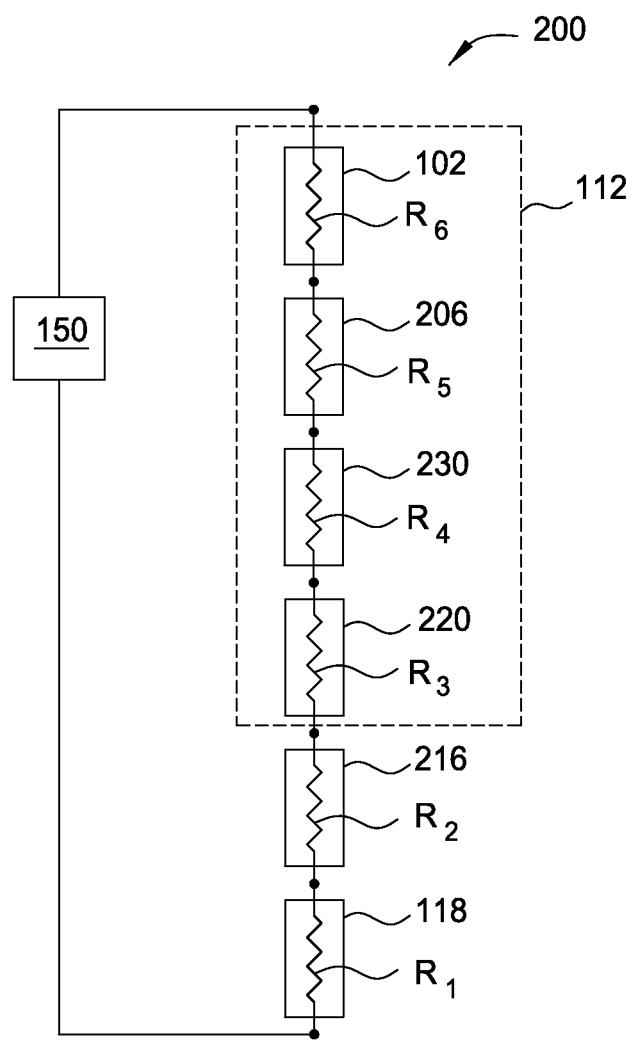
FIG. 2C is a schematic representation of an electrical circuit formed in accordance with one embodiment of the invention.

FIG. 2C schematically illustrates an electrical circuit formed in the memory device 200, according to one or more embodiments of the invention. The memory device 200 is generally coupled to a read-and-write circuitry 150 using word-lines and orthogonal bit-lines (generally referred herein as the electrodes 102 and 118) used to read from or write data into the memory devices 200. A plurality of the electrodes 102 and 118, bit lines, word lines, and source-lines within the memory arrays are typically biased by at least one current or voltage delivering device, such as the read-and-write circuitry 150. The arrays of the memory devices 200 are generally connected to the read-and-write circuitry 150, which is often connected to connection points located at the periphery of a memory chip. For example, the electrodes 102 and/or 118 can be biased by the read-and-write circuitry 150.

In one embodiment, at least one current-limiting layer 220 and at least one current-reducing layer 230 are incorporated into each of the memory devices 200 to control the current flowing therethrough when a pulse of energy, such as a voltage pulse or current pulse, is applied by the read-and-write circuitry 150 during the electrical forming process, sensing process, or device programming operations. The electrical circuit within the memory device 200 includes: a top electrode impedance (e.g., resistance $R_6$) created by the material layer(s) in the electrode 102, a variable resistance layer impedance (e.g., resistance $R_5$) created by the material layer(s) in the variable resistance layer 206, a current-reducing layer impedance (e.g., resistance $R_4$) created by the material layer(s) in the current-reducing layer 230, a current-limiting layer impedance (e.g., resistance $R_3$) created by the material layer(s) in the current-limiting layer 220, a current steering element impedance (e.g., resistance $R_2$) created by the material layer(s) in the current steering element 216, and a bottom electrode impedance (e.g., resistance $R_1$) created by the material layer(s) in the electrode 118. Additionally, the electrical circuit of the memory device 200 may also include an intermediate electrode impedance (e.g., resistance $R_{IEL}$) created by the material layer(s) in the intermediate electrode layer 210.

FIGS. 3A-3D schematically illustrate cross-sectional views of four examples of the memory devices 200 having at least one current-limiting layer 220 and at least one the current-reducing layer 230 disposed within two electrodes (e.g., the electrodes 102 and 118 of the memory device 200), according to one or more embodiments of the invention. The examples here are merely illustrative and not an exhaustive list of all examples. In general, one or more material layers used to form the memory device 200 is formed over, or integrated with and disposed over, a portion of the surface of the substrate 201, which can be for example, any semiconductor wafers, semiconductor substrates, silicon substrates, SOI substrates, among others.

In one embodiment, the current-limiting layer 220 is disposed within the electrodes of the memory device 200 close to (e.g., adjacent, next to, near, over, atop, under, below) the variable resistance layer 206 and/or current steering device 216 to effectively limit current spikes or prevent programming currents delivered through the memory device 200 from damaging the layers formed therein during normal device operation. In one example, as shown in FIG. 3A, the current-limiting layer 220 is formed within the MIM stack of the resistive switching memory element 112, such as being disposed between the electrode 102B and the variable resistance layer 206, over the surface of a substrate 201. The current-limiting layer 220 may be a resistive material-containing layer deposited to a thickness of between 50 angstroms and about 500 angstroms over the surface of the variable resistance layer 206 using a deposition process, such as an ALD, CVD, PVD or other similar process. In another example, as shown in FIG. 3B, the current-limiting layer 220 is disposed between the electrodes 102A, 102B by depositing a resistive material-containing current-limiting layer 220 over the surface of the electrode 102B using an ALD, CVD, PVD or other similar process. In yet another example, as shown in FIG. 3C, the current-limiting layer 220 is disposed between the electrode 118B and the variable resistance layer 206 by depositing a resistive material-containing current-limiting layer 220 over the surface of the electrode 118B using an ALD, CVD, PVD or other similar process. In the example of FIG. 3D, the current-limiting layer 220 is disposed between the electrodes 118A, 118B by depositing a resistive material-containing current-limiting layer 220 over the surface of the electrode 118A using an ALD, CVD, PVD or other similar process.

In another embodiment, the current-reducing layer 230 is adjacent to (e.g., next to, near, over, above, atop, under, below) the variable resistance layer 206, such as between the variable resistance layer 206 and an electrode layer (e.g., the electrodes, 102, 102B, 118, 118B, 210) or is formed into a portion of the variable resistance layer 206 to reduce the magnitude of the programming currents delivered through the memory device 200. In the example as shown in FIG. 3A, the current-reducing layer 230 is disposed adjacent to the variable resistance layer 206 (e.g., between the variable resistance layer 206 and the electrode 118B). In this configuration, the current-reducing layer 230 can be formed by chemically treating the surface of the electrode 118B with a buffered cleaning solution or a chemical oxidation solution, as discussed below.

For example, the electrode 118B may be a silicon-containing material layer and the surface of the electrode 118B may be cleaned with a buffered cleaning solution to form a thin native silicon-oxide layer and serve as the current-reducing layer 230. The buffered cleaning solution can be any suitable cleaning solution for cleaning the surface of a surface known in the art, for example, the buffered cleaning solution may contain one part of about 49% of hydrogen fluoride (HF) and one part of distilled water, resulting in a water solution of about 24.5% (about 14.2 mol/L) of hydrogen fluoride. As another example, the buffered cleaning solution may be a diluted hydrogen fluoride (DHF) solution, which contains 1:200 of HF:water. As still another example, the buffered cleaning solution may be a buffered hydrogen fluoride (BHF) solution, which contains seven parts of about 40% of NH4F and one part of about 49% (about 28.4 mol/L) of hydrogen fluoride (HF). As still another example, the buffered cleaning solution may contain two parts of BHF mixed with one part of glycerol. In general, a substrate having a surface of the electrode 118B may be put in the cleaning solution for a period of time before being rinsed in a solution of distilled water and dried with a nitrogen gun. Alternatively, the surface of the electrode 118B may be cleaned by a vapor of HF and water in a substrate processing system, where nitrogen gas is bubbled at 0.1 to 1 liter/min through a 49% HF solution to generate a vapor of HF and water for etching and cleaning the surface of the electrode 118B.

As another example, by providing an electrode (e.g., the electrode 118B) that comprises a silicon material or an electrode that has been cleaned with a buffered cleaning solution to have a thin layer of a native silicon oxide material formed thereon), the surface of the electrode (e.g., the electrode 118B) can be treated with a chemical oxidation solution to further form a thin layer of silicon oxide of about 5 angstroms to about 20 angstroms. The film quality of the formed, chemically oxidized thin layer of silicon oxide is good to be used as the current-reducing layer 230. The chemical oxidation solution used to form the thin layer of silicon oxide can be any suitable chemical cleaning solution for cleaning the surface of a surface known in the art, for example, the chemical cleaning solution may contain a mixture of ammonium hydroxide ($NH_4OH$), hydrogen peroxide ($H_2O_2$), and de-ionized (DI) water. The ratio of $NH_4OH$ to $H_2O_2$ to DI water may be from about 1:1:5 to about 1:4:50. As still another example, the electrode 118B may comprise a silicon-containing material and a substrate fabricated with the silicon-containing electrode 118B can be placed inside a substrate-processing chamber (e.g., an ALD or CVD substrate processing chamber and treated with ozone ($O_3$) gas a temperature of about 200° C. to about 350° C. for about 1 minute to about 60 minutes to form a thin layer of silicon oxide over the surface of the silicon-containing electrode 118B to be used as the current-reducing layer 230. As still another example, the cleaned surface of the electrode 118B may form a native silicon oxide layer and may be further treated with a nitrogen-containing ($N_2$) plasma a temperature of about 20° C. to about 300° C. for about 30 seconds to about 500 seconds inside a substrate-processing chamber.

In an alternative example, in the same configuration of FIG. 3A, the current-reducing layer 230 may comprise a doped metal oxide material formed by ALD, CVD, PVD, or other similar process. In one example, the current-reducing layer 230 is formed by depositing a metal oxide film by CVD, doping the metal oxide film with a dopant, such as zirconium (Zr) or aluminum (Al) to an appropriate dopant level of between about 1E16 atoms/cm$^3$ and about 1E19 atoms/cm$^3$ (e.g., between about 1E16 cm$^{-3}$ and about 5E17 atoms/cm$^3$). Alternatively, doping of the current-reducing layer 230 may be performed after current-reducing layer 230 is deposited (e.g., doping a deposited film by an ion implant process). As an example, a metal oxide layer can be deposited and doped with a dopant in a CVD deposition process to a thickness of between about 5 Å and about 15 Å thick at a temperature of 300° C. or above, such as between 580° C. and 650° C. Alternatively, a dopant can be introduced during the deposition of the metal oxide layer. For example, the current-reducing layer 230 may comprise a doped hafnium oxide material formed to a thickness of between about 5 Å and about 15 Å, such as an aluminum doped hafnium oxide layer or a zirconium doped hafnium oxide layer. In one example, the current-reducing layer 230 may be a doped hafnium oxide material layer deposited as a portion of a hafnium oxide-containing variable resistance layer during the deposition of the hafnium oxide-containing variable resistance layer 206 over the surface of the electrode 118B. A dopant material, such as aluminum or zirconium, can be introduced into an ALD or CVD process chamber together with process gasses for depositing a hafnium oxide variable resistance layer 206 until a thickness of between about 5 Å and about 15 Å of doped hafnium oxide is obtained.

Once the doped hafnium oxide material layer is formed to the desired thickness, the bulk of the variable resistance layer 206 can be conveniently deposited in the same deposition chamber by stopping the flow of the dopant and continuously delivering the process gases for hafnium oxide into the deposition chamber. Alternatively, the doped hafnium oxide-containing current-reducing layer can be deposited as a separate thin layer over the surface of the electrode 118B prior to depositing the variable resistance layer 206 by introducing a dopant together with process precursors for metal oxide inside an ALD, CVD, PVD or similar deposition chamber. Next, the variable resistance layer 206 is deposited using an ALD, CVD, PVD or other similar process. Once the variable resistance layer 206 is deposited, the current-limiting layer 220 can be deposited over the surface of the bulk of the variable resistance layer 206, and then the electrodes 102B, 102A can be deposited over the current-limiting layer 220.

To further enhance the film quality of the formed current-limiting layer 220 and the formed current-reducing layer 230, the deposited material layers can be subjected to various post-deposition treatment processes. As an example, the surface of the electrode 118B may be cleaned with a cleaning solution to form a thin layer of silicon-oxide containing current reducing layer 230 and further treated with an ammonium ($NH_3$)-containing solution or a plasma containing nitrogen ($N_2$) or oxygen ($O_2$) to enhance the film quality of the formed thin layer of silicon-oxide containing current-reducing layer 230. As another example, once the current-limiting layer 220 and/or the current-reducing layer 230 are deposited on the substrate 201, the surface of the substrate 201 can be subject to a post-deposition annealing process (e.g., rapid thermal anneal with oxygen rich ambient, rapid thermal anneal with nitrogen rich ambient, rapid thermal anneal with an ambient of about 96% hydrogen and 4% argon forming gases, rapid thermal anneal with argon gas, among others.) in an substrate processing chamber (e.g., a rapid thermal oxidation (RTO) chamber, a rapid thermal nitradation (RTN) chamber, a rapid thermal anneal (RTA) chamber, among others.)

In the example as shown in FIG. 3B, the current-reducing layer 230 is disposed close to or adjacent (e.g., next to, near, over, above, atop, under, below) the variable resistance layer 206, such as between the variable resistance layer 206 and an electrode layer (e.g., the electrodes, 102, 102B, 118, 118B, 210) or it can be formed into a portion of the variable resistance layer 206 to reduce the magnitude of the programming current delivered through the memory device 200. The current-reducing layer 230 may be deposited over the surface of the electrode 118B prior to depositing the variable resistance layer 206, the electrode 102B, and the electrode 102A over the surface of the substrate 201. The example of FIG. 3B differs from the example of FIG. 3A in that the current-limiting layer 220 is deposited over the surface of the deposited electrode 102B and is thus disposed in series with the MIM stack of the resistive switching memory element 112 to limit the current flowing through the resistive switching memory element 112.

In the example as shown in FIG. 3C, the current-reducing layer 230 is deposited adjacent (e.g., next to, near, over, above, atop, under, below) the variable resistance layer 206, such as between the variable resistance layer 206 and an electrode layer (e.g., the electrodes, 102, 102B, 118, 118B, 210) or is formed into a portion of the variable resistance layer 206 to reduce the magnitude of the programming currents delivered through the memory device 200. In this configuration, the current-reducing layer 230 can be formed over the surface of the variable resistance layer 206 using an ALD, CVD, PVD or other substrate treatment solutions and processes as described above in the example of FIG. 3A. For example, the current-reducing layer 230 may comprise an oxide-containing material layer formed over the surface of the substrate 201 by treating the metal oxide-containing variable resistance layer 206 with a cleaning solution (e.g., a buffered cleaning solution or a chemical cleaning solution as described above) to form a thin native silicon-oxide layer that serves as the current-reducing layer 230. Alternatively, the current-reducing layer 230 may comprise a doped metal oxide material formed in the same or different ALD, CVD, PVD, or other similar process chamber for depositing the bulk of the variable resistance layer 206. A metal oxide containing variable resistance layer 206 can be deposited to a thickness from about 10 angstroms to 5000 angstroms at a temperature of 300° C. or above, such as between 580° C. and 650° C., and a portion of the variable resistance layer 206 can be doped with a dopant (e.g., aluminum or zirconium, among others) in the same or different CVD deposition process to a thickness from about 10 angstroms to 500 angstroms at a temperature of 300° C. or above, such as between 580° C. and 650° C. In the example as shown in FIG. 3C, the current-limiting layer 220 is disposed between the electrode 118B and the variable resistance layer 206 prior to depositing the current-reducing layer 230 comprising a silicon oxide or doped hafnium oxide material.

In the example as shown in FIG. 3D, the current-reducing layer 230 is disposed close to or adjacent (e.g., next to, near, over, above, atop, under, below) the variable resistance layer 206, such as between the variable resistance layer 206 and an electrode layer (e.g., the electrodes, 102, 102B, 118, 118B, 210) or is formed into a portion of the variable resistance layer 206 to reduce the magnitude of the programming currents delivered through the memory device 200. In this configuration, the resistive material-containing current-limiting layer 220 is disposed between the electrodes 118A, 118B and the current-reducing layer 230 is formed over the surface of the electrode 118B using an ALD, CVD, PVD or other substrate treatment solutions and process techniques as described above in the example of FIG. 3A.

To obtain the current-limiting layer 220 and the current-reducing layer 230 as described in FIGS. 1A-1B, 2A-2B, 4A-4B and 6 with desirable electrical and/or physical properties, one or more steps can be adjusted in a deposition process to form the material layers within the memory device 200. In some cases it is desirable to adjust the resistivity (ρ) and thickness (L) of the current-limiting layer 220 and the current-reducing layer 230 so that the resistance ($R_3$) of the current-limiting layer 220 and/or the resistance ($R_4$) of the current-reducing layer 230 is designed to match the resistance of the formed current steering element 216 in the formed memory device 200. One skilled in the art will appreciate that the resistance (R) to current flow through a thin film is equal to the resistivity (ρ) of the film times the length (L) of the film divided by its cross-sectional area (A), or resistance R=ρ(L/A), where the length "L" is the thickness of the layer that the current flows through and the cross-sectional area (A) is measured perpendicular to the current flow direction (e.g., perpendicular to the thickness direction).

Resistivity (ρ) is an intrinsic property of the formed layer that can be adjusted in some cases by adjusting the composition of the layer, such as adding alloying elements or doping atoms, or by adjusting the crystalline structure of the layer (e.g., crystal structure). Since the cross-sectional area (A) of the memory device is generally fixed by the size and lateral spacing of the memory devices 200 formed on a memory chip, and thus is generally not easily varied from one memory device to the next, thus, the resistance of the current-limiting layer 220 and the current-reducing layer 230 can be controlled by the adjustment of the thickness "L" and/or the resistivity (ρ) of the current-limiting layer 220 and the current-reducing layer 230.

Typical deposition processes may include ALD, PVD and CVD processes that can be tailored to adjust the material resistivity and thickness of the deposited material layers within the current-limiting layer 220 and the current-reducing layer 230. In general, the current-limiting layer 220 and the current-reducing layer 230 as shown in FIGS. 3A-3D can be deposited using a deposition process, including but not limited to, chemical vapor deposition (CVD) (e.g., LPCVD, PECVD), ALD (e.g., plasma enhance atomic layer deposition (PEALD)), physical vapor deposition (PVD), liquid deposition processes, ion implants, and epitaxial processes, among others. In addition, the current-reducing layer 230 can be formed adjacent the variable resistance layer 206 by various post-deposition substrate treatment solutions and processes as described above. The thickness of the current-limiting layer 220 may be between about 10 Å and 1000 Å and the thickness of the current-reducing layer 230 may be between about 10 Å and 1000 Å. In order to effectively reduce current spikes and limit current flowing through the resistive switching memory element 112. For example, the current-limiting layer 220 and the current-reducing layer 230 can be deposited with a resistivity of between about 1 Ω-cm and about 10 Ω-cm, which depends on its thickness, device geometry, and device specification requirements. For a device specification of a switching voltage of 2 volts (V) and maximum current of 10 microamps (μA), the total resistance of the memory device required under the device specification is about 200 KΩ. As a result, the current-limiting layer 220 can have low resistance of between about 10 KΩ and about 200 KΩ at a thickness of between 15 Å and about 150 Å and the current-reducing layer 230 can have a thickness of between 5 Å and about 20 Å to meet the compliance programming current levels of below 10 μA (e.g., between about 1 μA and about 10 μA) and a switching voltage level ranging from 1V to 10V. For example, the resistance of the current-limiting layer 220 may be adjusted to provide the total resistance of the memory device (e.g., a resistance of 100 KΩ provided by the current-limiting layer 220 as the device resistance during a "reset" operation). In addition, as shown in FIGS. 3A-3D, the current-limiting layer 220 can be disposed "in series" or "within" the layers of the resistive switching memory element 112 to limit current and reduce the magnitude of any current spikes, and the current-reducing layer 230 is disposed "within" the layers of the resistive switching memory element 112 to limit current and reduce the magnitude of the current levels flowing through the resistive switching memory element 112.

It is noted that the order of performing the deposition steps depends on the design choice in forming the memory device. For example, the current-limiting layer 220 and the current-reducing layer 230 can be formed prior to, or after, the variable resistance layer 206 is deposited. In addition, the electrode layers (e.g., the electrodes 102, 118, 210, 102A, 102B, 118A and/or 118B disposed in the memory device 200 as shown in FIG. 1, 2A-2C, 3A-3D) can be deposited prior to, or after, the current-limiting layer 220 and the current-reducing layer 230 are formed. In addition, the entire material stack of the memory device 200 can be subject to a post-deposition annealing treatment. The annealing treatment of the deposited material layers of the memory device 200 may be performed, for example, at high temperature of between 200° C. and 750° C. and for a period of time (e.g., between 1 minute and 5 minutes). Annealing is used to activate the materials within layers and enhance adhesion between the layers.

According to one embodiment of the invention, the resistive switching memory elements 112 as shown in FIGS. 1, 2A-2C, 3A-3D is a bistable memory element having two stable resistance states, which may include a high resistance state (HRS) and a low resistance state (LRS), by applying suitable voltages or currents. The resistive switching memory elements 112 of the memory device 200 may use bipolar switching, which uses set and reset voltages ($V_{SET}$ and $V_{RESET}$) having opposite polarities to alter the resistance of the resistive switching memory element 112 between the high and low resistance states.

Conventional Resistive Switching Memory Devices

Figure 4A:
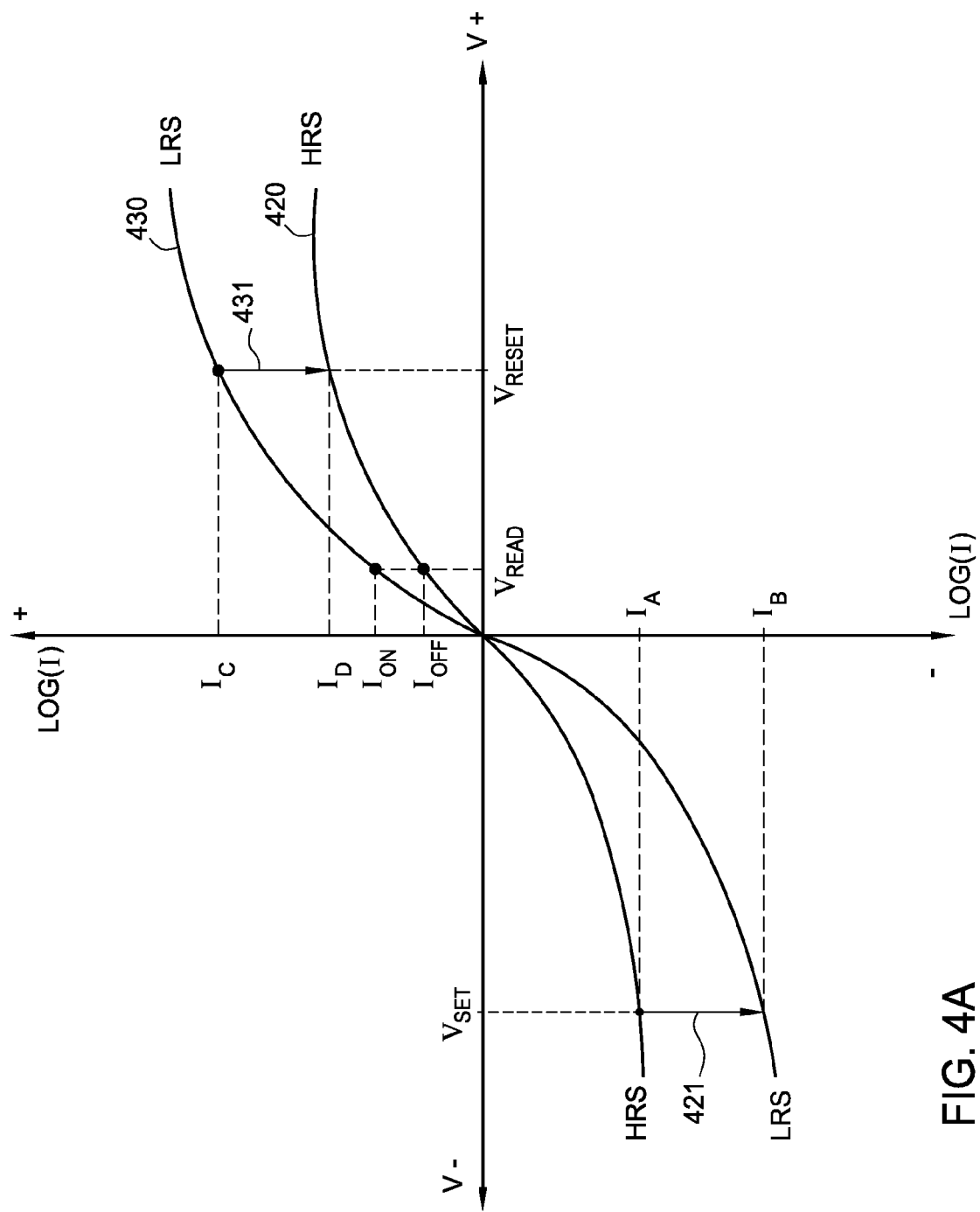
FIG. 4A is a graph illustrating the current (I) versus voltage (V) characteristics of the high and low resistance load lines of a variable resistance layer in accordance with an embodiment of the invention.

FIG. 4A schematically illustrates exemplary log-log plots of measured current (I) values versus applied voltages (V) of a memory device having a resistive switching memory element 112 having two bistable resistive states, a low-resistance-state (LRS) curve 430 and a high-resistant-state (HRS) curve 420. By sweeping the voltage applied to the electrodes 102 and 118 between two applied voltages (e.g., between $V_{SET}$ (e.g., −3 volts) and $V_{RESET}$ (e.g., +4 volts)) while the memory device is in the low resistance state, the LRS curve 410 can be created. On the other hand, by sweeping the voltage applied to the electrodes 102 and 118 between two applied voltages (e.g., between $V_{SET}$ and $V_{RESET}$) while the device is in the high resistance state, the HRS curve 420 can be created.

Accordingly, the resistive switching memory element 112 of a memory device may either be in a high resistance state (HRS) or a low resistance state (LRS). The resistive switching memory elements 112 within a memory device can be selectively chosen by the read-and-write circuitry 150 to switch between its resistance states. The current steering element 216 is used to regulate (e.g., allow or inhibit, etc.) the currents flowing through only the desired memory elements when the appropriate set of word-lines and bit-lines and/or electrodes are selected. Depending on the physical and electrical characteristics of the variable resistance layer 206, the memory device will switch from the HRS to the LRS (i.e., arrow 421) during a "set" operation when a $V_{SET}$ is applied. On the contrary, the variable resistance layer 206 of the memory device will function to switch from the LRS to the HRS (i.e., arrow 431) during a "reset" operation when a $V_{RESET}$ is applied.

Figure 4B:
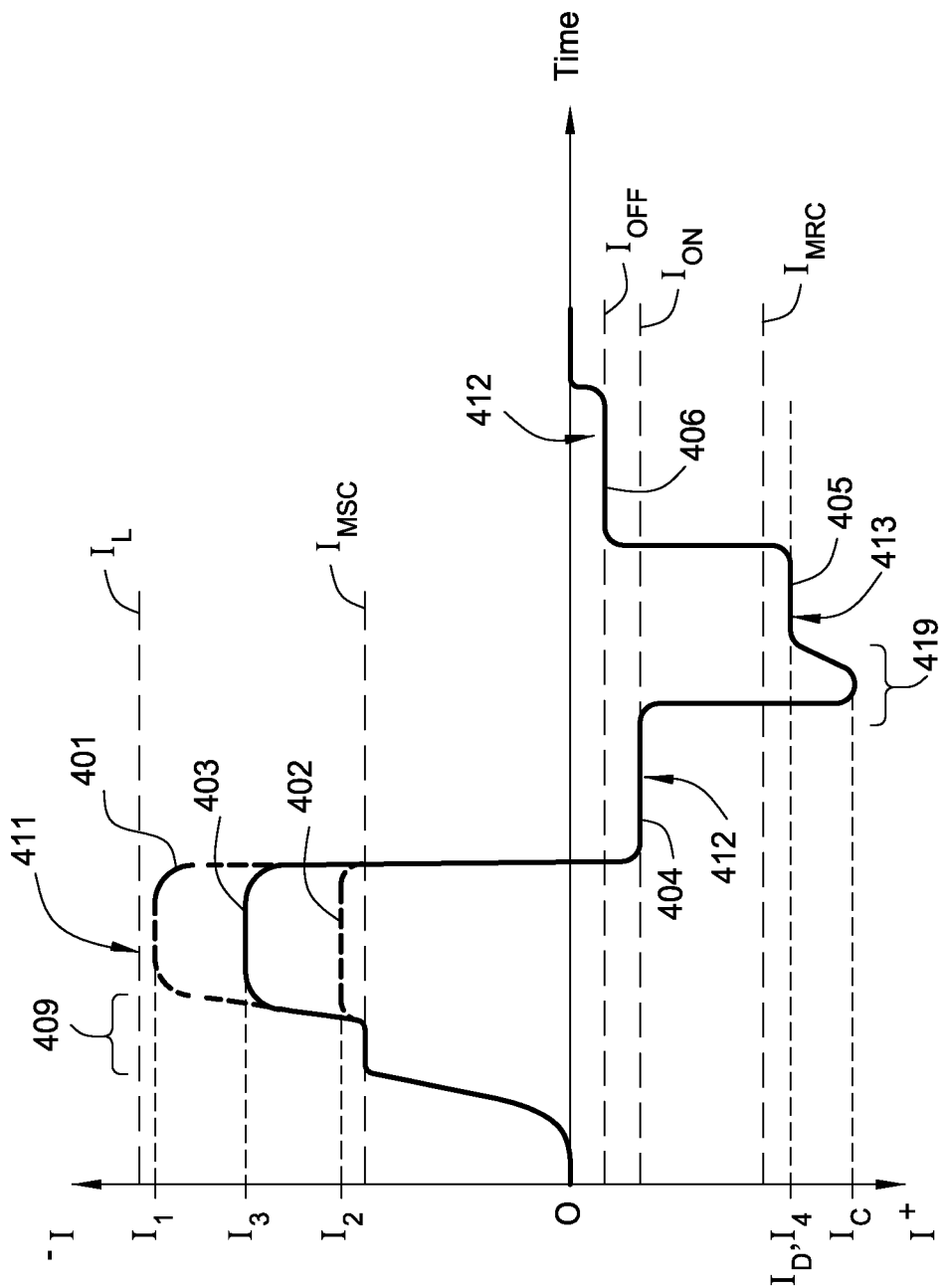
FIG. 4B is a current versus time plot illustrating the effect of delivering bipolar type switching pulses through a memory element in accordance with an embodiment of the invention.

FIG. 4B is a plot of current versus time for a plurality of bipolar type "set" and "reset" switching pulses delivered to a memory device, as illustrated by pulses 401, 402, 403, 404, 405, and 406, in accordance with an embodiment of the invention. Initially, in an effort to prepare the resistive switching memory element 112 for use, it is common to apply a forming voltage ($V_{FORM}$) at least once across the electrodes 102 and 118 to "burn-in" the memory device, prior to a series of programming "read" and "write" operations.

In one example, as shown in FIG. 4B, a device programming step may include the delivery of a "set" switching pulse 411, a "reset" switching pulse 413, and two "sensing" pulses 412. To assure that the memory element 112 reliably switches from a high resistance state (HRS) to a low resistance state (LRS) and vice versa, one must assure that the "set" switching pulse 411 produces a current that is greater than a minimum "set" current $I_{MSC}$, which is defined as the minimum current required to flow through the variable resistance layer 206 to cause it to switch from a high resistance state (e.g., 2.5 MΩ) to a low resistance state (e.g., <<250 kΩ). In one example, the high and low resistance states of the variable resistance layer 206 may be about 2.5 MΩ and about 100 kΩ, respectively.

In addition, to assure that the resistive switching memory element 112 reliably switches from a low resistance state to a high resistance state, the "reset" switching pulse 413 is generally delivered at a current level that is greater than a minimum "reset" current, $I_{MRC}$, which is defined as the minimum current required to flow through the variable resistance layer 206 to cause it to switch from a low resistance state to a high resistance state. It should be noted that the minimum "set" current, $I_{MSC}$, and the minimum "reset" current, $I_{MRC}$, are related to the physical and/or electrical properties of the material within the variable resistance layer 206, and thus may be adjusted by careful selection of the material(s) and/or physical properties (e.g., thickness) of the variable resistance layer 206 and by performing various post-processing steps after forming the variable resistance layer within the stack of the resistive switching memory element 112.

Referring to FIG. 4A, in one example, when a "set" switching pulse 411 is delivered through a standard switching memory device, the memory device will switch from the high-resistance-state (HRS) to the low-resistance-state (LRS), as shown by the arrow 421. One will note that the current flowing through a memory device will shift from the initial "set" current $I_A$ to the final "set" current $I_B$ during the "set" operation, due to the change in resistance ($R_{VR}$) of the variable resistance layer 206. One will note that the initial "set" current $I_A$ will typically equal the minimum "set" current $I_{MSC}$, which is discussed above.

Alternately, when a "reset" switching pulse 413 is delivered through a standard switching memory device, the memory device will switch from the low-resistance-state (LRS) to the high-resistance-state (HRS), as shown by the arrow 431. One will note that the current flowing through the switching memory device will shift from the initial "reset" current $I_C$ to the final "reset" current $I_D$ during the "reset" operation, due to the change in resistance ($R_{VR}$) of the variable resistance layer 206.

Referring to FIG. 4B, the "sensing" pulse 412 may be applied to an appropriate set of the electrodes 102 and 118 during various "programming" operations, such as a "read" operation, to sense the resistance state of the resistive switching memory element 112 in the memory device. For example, the pulse 406 at a sensing voltage level, e.g., a "read" voltage level, $V_{READ}$, such as about +0.5 volts (V) or other suitable voltage levels may be applied. In one example, the resistive switching memory element 112 may initially be in a high resistance state (e.g., capable of storing a logic "zero"). The read-and-write circuitry 150, which is connected to the electrodes 102 and 118, may apply a read voltage, $V_{READ}$, to the resistive switching memory element 112 to sense the high resistance state of resistive switching memory element 112, and the resulting "off" current ($I_{OFF}$) flowing through the resistive switching memory element 112 is sensed.

The "set" switching pulse 411, which may be in opposite polarity of the "sensing" pulse 412, may then be applied to an appropriate portion of the electrodes 102 and 118 to place the resistive switching memory elements 112 within these memory devices into its low-resistance state, when it is desired to store a logic "one" in a specified set of memory devices. The read-and-write circuitry 150 may apply the pulse 401 at a set voltage level, $V_{SET}$, which is often a negative voltage (e.g., an applied voltage level in the range between –2 Volts and –4 Volts) across the electrodes 102 and 118. Depending on its past history, the resistive switching memory element 112 can either be in an initial high resistance state or an initial low resistance state. Thus, in one configuration, applying the "set" switching pulse 411 to the resistive switching memory element 112 causes it to switch to its low resistance state (e.g., the arrow 421 as shown in FIG. 4A). The change in the resistance state of resistive switching memory element 112 may be due to the redistribution or filling of traps (i.e., "trap-mediated"), or defects, in a resistive material layer with variable resistance (e.g., the variable resistance layer 206 in FIGS. 2A and 2B), when the device is reverse biased. The defects or traps are commonly formed during the deposition, initial burn-in, or forming of the variable resistance layer 206, and these defects or traps are often created by a non-stoichiometric material composition found in the formed variable resistance layer 206. $V_{SET}$ and $V_{RESET}$ are generally referred to as "switching voltages" herein. In turn, the overall resistance of the resistive switching memory element 112 determines what digital data is being stored by the memory device.

During a "write" operation, the state of the resistive switching memory element 112 can be changed into a desired state by applying various suitable write signals (e.g., biasing the read-and-write circuitry 150 with desired currents, voltages, etc.) to an appropriate set of the electrodes 102 and 118 of the memory device. Initially, a low resistance state of the resistive switching memory element 112 can first be sensed using the read and write circuitry 150 by applying the "sensing" pulse 412 (e.g., the pulse 404 at the "read" voltage level, $V_{READ}$) to the resistive switching memory element 112, the read-and-write circuitry 150 may sense the relatively high "on" current value ($I_{ON}$), indicating that the resistive switching memory element 112 is in its low resistance state.

The "reset" switching pulse 413, which is usually in the same polarity as the "sensing" pulse 412, may then be applied to an appropriate portion of the electrodes 102 and 118 to place the resistive switching memory element 112 within the these memory devices into high-resistance state, when it is desired to store a logic "zero" in a specified set of the memory devices. The read-and-write circuitry 150 may apply the "reset" switching pulse 413 (e.g., the pulse 405 at a set voltage level, $V_{RESET}$) which is often a positive voltage (e.g., an applied voltage level in the range between +2 Volts and +5 Volts) across the electrodes 102 and 118 to reset the resistive switching memory element 112 to its high resistance state (e.g., the arrow 431 as shown in FIG. 4A). When the "reset" switching pulse 413 at the reset voltage level, $V_{RESET}$, is removed, the resistive switching memory element 112 can once again be characterized as in its high resistance state when another "sensing" pulse at the read voltage level, $V_{READ}$ (e.g., the pulse 406) is applied.

Accordingly, a plurality of the voltage pulses 401, 402, 403, 404, 405, 406, 411, 412, 413 can be applied for a period of time to switch and sense the resistance states of the resistive switching memory element 112 in the programming of the memory device. For example, a square or trapezoidal shaped pulse for a period of about 1 microseconds (ms) to about 1 nanoseconds (ns) can be used to switch the resistive switching memory element 112. In some embodiments, it may be desirable to adjust the length of each pulse, depending on the amount of time needed to switch the resistive switching memory element 112. In one example, the "set" and "reset" pulses are each about 10 nanoseconds (ns) in length. While the discussion of the resistive switching memory element 112 herein primarily provides bipolar switching examples, some embodiments of the resistive switching memory element 112 may use unipolar switching, where the set and reset voltages have the same polarity, without deviating from the scope of the invention described herein.

To provide a measurable difference between the logic "zero" and logic "one" states, it is common to form the variable resistance layer 206 and other components of the resistive switching memory element 112 so that the difference between the $I_{ON}$ and $I_{OFF}$ currents have a difference of at least one order of magnitude, for example, a current ratio $I_{ON}/I_{OFF}$ of about 5 or above. In other words, the ratio of the electrical resistances of the variable resistance layer 206 is decreased by at least 5 times when switching between the high and the low resistance states.

In operation of a conventional memory device, a "set" switching pulse, such as the pulse 401 as shown in FIG. 4B, is delivered through the conventional memory device to set a low resistance state or logic "one" state. In this case, a set voltage $V_{SET}$ is applied across the electrodes of the conventional memory device, which creates a first "set" current, $I_1$, to flow through the conventional memory device, due to the impedance of the electrical components found in the memory element. The first "set" current, $I_{SET}$ or $I_1$ is equal to the applied "set" voltage $V_{SET}$ divided by the sum of the impedances of a top electrode layer (TEL), a variable resistance layer (VR), an optional intermediate electrode (TEL), a current steering element (CSE), and a bottom electrode layer (BEL) within the memory device. Therefore, in one example, the first "set" current $I_1$ is measured as:

$$I_{SET}=I_1=V_{SET}/(R_{TEL}+R_{VR}+R_{IEL}+R_{CSE}+R_{BEL})$$

It was found that the first "set" current $I_1$ in a conventional memory device may vary during the time that the "set" switching pulse is initially applied across the electrodes 102 and 118. The first "set" current $I_1$ may have a low current region 409 that is created due to the electrical properties of the material as it switches from the HRS to the LRS, and also have a final "set" switching region 411, where a final "set" current, $I_B$, can flow through the conventional memory device. Since the actual impedance of various electrode layers is generally small, due to the need to reduce the power loss in the device, and the impedance of a variable resistance layer is desirably low to achieve a logic "one" state, the impedance of the current steering element generally dominates the circuit of conventional memory devices (e.g., $R_{CSE} \gg R_{TEL}+R_{IEL}+R_{BEL}+R_{VR}$) and the impedance of the circuit in this state equals approximately to the impedance of the current steering element ($R_{CSE}$).

$$I_{SET}=I_1 \sim I_B \sim V_{SET}/R_{CSE}$$

It was found that the resistances of the circuit in a conventional memory device at switching voltages are actually measured to be lower than expected. This is a problem because the magnitude of the set current $I_1$ created by the pulse 401 became very close to the maximum current ($I_{MAX}$), or load current $I_L$, for such conventional memory devices, where $I_{MAX}$ or $I_L$ equals approximately to the set voltage divided by the impedance of the current steering element:

$$I_1=I_{MAX}=I_L \sim V_{SET}/R_{CSE}$$

One will note that the difference between the "set" current $I_1$ and the minimum $I_{MSC}$ current is much larger than necessary to cause the device to reliably switch to the logic "one" state. However, in practice it has been found that the high currents delivered through conventional memory devices can permanently damage the memory element components and cause cross-talk to occur between adjacently connected devices. Thus, the magnitude of the "set" current, $I_{SET}$ or $I_1$, is particularly important for bipolar switching applications that require a current steering element to be reverse biased to "set" the resistance of the memory element into a low resistance state. The act of driving a high current through the current steering element 216, in a non-forward direction, can breakdown, generate heat within and ultimately damage the material layers used to form the current steering element and the resistive switching memory element, thus reducing the effective lifetime of the current steering element and/or the resistive switching memory element. It has been found that, since the current steering element provides the primary voltage drop in the memory device during the "set" operations (e.g., switch to "on" state), the current steering element often is required to operate near its breakdown voltage to reliably cause the variable resistance layer to switch. The application of the current steering element in this regime causes its impedance to drop over time due to damage to the material layers in the current steering element. Typically the resistance ($R_{CSE}$) of an undamaged reverse biased diode type current steering element, for example, may be in a range between about 1 and about 100 mega-ohms (M$\Omega$), while the resistance of a forward biased diode type current steering element may be between about 1 and about 20 kilo-ohms (k$\Omega$).

Therefore, after performing the "set" operation by applying the "set" switching pulse 411, it is common to apply a "sensing" pulse 412 to assure that the logic "one" state has been achieved. The application of a sensing pulse 412, such as sensing pulse 404 in FIG. 4B, is generally performed by applying a $V_{READ}$ voltage (e.g., +0.5V) across the electrodes. If the "set" operation was performed correctly, the current through a memory device during this sensing step equals the $I_{ON}$ current, which equals the $V_{READ}$ voltage divided by the impedance of the circuit ($I_{ON}=V_{READ}/R_{TOTAL}$). For a memory device that has the variable resistance layer in a low resistance state, the $I_{ON}$ current will approximately equal to the $V_{READ}$ voltage divided by the impedance of the current steering element.

$$I_{ON} \sim V_{READ}/R_{CSE}$$

Next, in cases where it desirable to change the resistive switching memory element 112 from a low resistance state (i.e., logic "one" state) to a high resistance state (i.e., logic "zero" state), a "reset" switching pulse 413, such as the reset switching pulse 405 in FIG. 4B, is delivered through a memory device. One will note that the largest current that is delivered through the switching memory device during the "reset" operation will be achieved when the initial "reset" current $I_C$ flows through the device. The current flowing through the device during the "reset" operation will then tend to drop as the variable resistive layer 206 switches from a LRS to a HRS (e.g., the arrow 431 as shown in FIG. 4A). Therefore, the pulse 413, which is schematically illustrated in FIG. 4B, will generally have high current portion 419 at the start of the delivered pulse 413 and a stable region that equals the "reset" current $I_4$ during the later stages of the "reset" operation. Therefore, the "reset" current $I_4$ achieved during the "reset" switching pulse 413 will generally equal the final "reset" current $I_D$ and the maximum current achieved during the pulse 413 will equal the initial "reset" current $I_C$.

It has been found that the magnitude of the current required to switch a resistive switching memory element from a low resistance state to a high resistance state is dependent on the magnitude of the current used to "set" the device in the low resistance state. If a high "set" current, such as current $I_1$, is delivered to the resistive switching memory element, then a higher "reset" current is required to achieve a desirable high resistance state. Stated another way, the difference between the initial "reset" current $I_C$, and/or the final "reset" current $I_D$, and the minimum "reset" current $I_{MRC}$ current ($I_C > I_d > I_{MRC}$) needs to be larger than necessary to cause the device to switch from the "on" to the "off" state if the magnitude of the prior applied "set" current is too far from the minimum "set" current $I_{MSC}$ ($I_{SET} = I_1 \gg I_{MSC}$). The larger than necessary swings in the current used to switch between the "on" and "off" states can damage the materials and components in the switching memory device, thus affecting the memory element's lifetime and reliability.

Next, after delivering the "reset" switching pulse 413, it is common to apply a "sensing" pulse 412, such as the sensing pulse 406 in FIG. 4B, to assure that the logic "zero" state has been achieved. The sensing pulse 412 is generally performed by applying a $V_{READ}$ voltage (e.g., +0.5V) across the electrodes. If a "reset" operation was performed correctly, the current through a memory device during this sensing step will equal the $I_{OFF}$ current, which equals to the $V_{READ}$ voltage divided by the sum of the impedance resistance of the current steering element ($R_{CSE}$) and the impedance resistance of the variable resistance layer ($R_{VR}$). Therefore, in one example, the $I_{OFF}$ current for a memory device will be as follows.

$$I_{OFF} = \sim V_{READ}/(R_{CSD} + R_{VR})$$

Integrating a Current-Limiting Layer and a Current-Reducing Layer in an Improved Memory Device As discussed above, embodiments of the invention integrate and incorporate at least one current-limiting layer 220 and at least one current-reducing layer 230 in a memory device, such as the memory device 200 as described in FIGS. 1, 2A-2C, 3A-3D, for limiting and/or minimizing the current spikes during sensing and programming the logic states for each of the interconnected memory devices 200 as well as reducing the magnitude of the current flowing through the interconnected memory devices 200 during device operation. Within the memory device 200, the MIM (metal-insulator-metal) stack of the resistive switching memory element 112 offers bistable resistance (e.g., LRS and HRS).

Referring back to FIG. 2C, when the read-and-write circuitry 150 applies a "set" pulse (e.g., the "set" switching pulse 411 or the pulse 403 as shown in FIG. 4B) at a "set" voltage level, $V_{SET}$, across the electrodes 102, 118 to "set" the memory device 200 into a low resistance state (LRS) or logic "one" state, a "set" current, $I_{SET^{}}$ (or $I_3$, as shown in FIG. 4B), is thus created. The "set" current, $I_{SET^{}}$ or $I_3$, flowing through the memory device 200 during this "set" operation equals the $V_{SET}$ voltage divided by the sum of all impedances within the memory device 200. Therefore, in one example, as shown in FIG. 2C, the set current, $I_{SET^{**}}$ or $I_3$, equals the following:

$$I_{SET^{**}} = I_3 = V_{SET}/(R_6 + R_5 + R_4 + R_3 + R_2 + R_1 + R_{IEL})$$

Since the impedance of the electrodes are generally small, due to the need to reduce the power loss in the memory device, and the impedance of the variable resistance layer 206 is desirably low to achieve a logic "one" state, the impedances of the current steering element 216, the current-limiting layer 220, and the current-reducing layer 230 will dominate the circuit (e.g., $(R_4 + R_3 + R_2) \gg R_1 + R_{IEL} + R_5 + R_6$) and the impedance of the circuit in this logic "one" state ($I_{CIRCUIT^{**}} = I_3$) is effectively equal to the sum of the impedances of the current steering element 216, the current-limiting layer 220, and the current-reducing layer 230 (i.e., $R_4 + R_3 + R_2$).

$$I_{SET^{**}} = \sim V_{SET}/(R_4 + R_3 + R_2)$$

Accordingly, the magnitude of the "set" current, $I_{SET^{}}$, is equal to the maximum current $I_{MAX^{}}$ for the memory device 200 near the end of the "set" switching pulse 411. Because of the presence of the added impedance of the current-reducing layer 230 ($R_4$) and the current-limiting layer 220 ($R_3$) in the memory device 200 (as compared to conventional memory devices), the maximum current, $I_{MAX^{}}$ ($I_{MAX^{}} = I_{SET^{**}} = I_3$) is thus smaller than $I_1 = I_{MAX} = I_L$, which as discussed above, is the maximum current that can flow through a conventional memory device without damaging the memory device. It should be noted that in a conventional memory device, the current steering element 216 typically provides the only impedance to current flow during this "set" operation.

$$I_{SET^{}} = I_3 = I_{MAX^{}} < I_1 = I_{MAX} = I_L = \sim V_{SET}/R_{CSE}$$

In general, it is desirable to form the current-limiting layer 220 and the current-reducing layer 230 so that their resistance (e.g., $R_3$ and $R_4$) limit the current flowing through the resistive switching memory element 112 to a value (e.g., the current $I_2$ as shown in FIG. 4B) that is just greater the minimum "set" current, $I_{MSC^{**}}$, of the memory device 200, as illustrated by the pulse 402, and still allow the logic "one" state to be reliably "set" by the applied $V_{SET}$ voltage.

$$I_2 = I_{MAX^{}} \text{ and } I_2 \text{ is designed to be close to } I_{MSC^{}}$$

$$I_{MSC^{}} < I_2 = I_{MAX^{}} \ll I_{MAX} = I_1$$

Incorporating the current-limiting layer 220 and the current-reducing layer 230 into the memory device 200 to function together with the resistive switching memory element 112 can help reduce the apparent minimum $I_{MSC}$ current required to cause the variable resistance layer 206 to change to a low resistance state, since the addition of the resistances of the current-reducing layer 230 ($R_4$) and the current-limiting layer 220 ($R_3$) in the circuit will reduce the swing in current required to "set" and "reset" the variable resistance layer 206 at the same fixed applied voltage. The reduction in the programming currents will thus affect the density and movement of the traps in the variable resistance layer 206 of the resistive switching memory element 112. Not intending to be bound by theory, but it is believed that when a smaller "on" state switching current is applied to a memory device, the formed filament(s) or aligned traps in the variable resistance layer will be smaller in size than if a higher "on" current is applied, thus making the filament(s) easier to alter during the "reset" phase of the resistive switching process.

The maximum current per unit area through the current-limiting layer 220 and the current-reducing layer 230 can be approximated by $I_{MAX^{**}}=nqv_s$, where n is the free carrier density through the layers, q is the charge of an electron, and $v_s$ is the saturation velocity of the electrons.

In one embodiment, the magnitude of the maximum current, $I_{MAX^{**}}$, through the memory device 200 is adjusted by the selection of the resistivity (ρ) and the thickness (L) of the current-limiting layer 220 and the current-reducing layer 230 in relation to the size of the memory device 200. For example, the current may be adjusted by defining the thickness of the current-limiting layer 220 and the current-reducing layer 230. As an example, for a memory device 200 with 15 nm×15 nm area, a current-limiting layer 220 having a thickness (L) of about 5 Å to 200 Å and a resistivity of between about 1 Ω-cm and about 10 Ω-cm and the current-reducing layer 230 having a thickness of about 5 Å to 50 Å are sufficient to provide the necessary resistance to control the current flowing through the memory device 200. As the size of the memory device 200 increases, the resistivity (ρ) and thickness (L) of the current-limiting layer 220 and the current-reducing layer 230 may need to be increased as well. Conversely as the size of the memory device 200 decreases, the resistivity and/or thickness of the current-limiting layer 220 and the current-reducing layer 230 may need to be reduced. Most likely, in order to reduce the aspect ratio of the overall material stack within a memory device, the thickness of the material layers within the resistor structure 220 can be advantageously reduced.

In operation of the memory device 200, a sensing pulse, such as the "sensing" pulse 412 (e.g., the pulse 404 in FIG. 4B), can be applied to the electrodes 102, 118 after performing the "set" operation to the memory device 200 and the logic "one" state has been achieved. If the "set" operation was performed correctly, the current through the memory device 200 during this sensing step equals the $I_{ON^{}}$ current, which equals the $V_{READ}$ voltage divided by the impedance of the circuit ($I_{ON^{}}=V_{READ}/R_{TOTAL}$, where $R_{TOTAL}=R_6+R_5+R_4+R_3+R_2+R_1+R_{IEL}$).

When the variable resistance layer 206 is in a low resistance state, the $I_{ON^{**}}$ current of the memory device 200 approximately equals the $V_{READ}$ voltage divided by the impedances of the current steering element 216, the current-limiting layer 220, and the current-reducing layer 230.

$$I_{ON^{**}}=\sim V_{READ}/(R_2+R_3+R_4)$$

The "reset" switching pulse 413, such as the "reset" switching pulse 405 as shown in FIG. 4B, can be delivered through the memory device 200, when it is desirable to change the resistive switching memory element 112 from a low resistance state (i.e., logic "one" state) to a high resistance state (i.e., logic "zero" state). In a conventional device, the difference between the "reset" current $I_4$ and the minimum "reset" current $I_{MRC}$ current needs to be larger ($I_4 > I_{MRC}$) than necessary to cause the conventional memory device to reliably switch from the "on" to the "off" state. As noted above, since the current steering element in a conventional memory devices is the primary voltage drop during "set" operations (e.g., switch to "on" state), conventional current steering elements are often required to operate near the breakdown voltage to reliably cause the variable resistance layer to switch, which is not the case in the memory device 200 due to the added voltage drop provided by the current-limiting layer 220 and the current-reducing layer 230. By adding the current-limiting layer 220 and the current-reducing layer 230, the "reset" current $I_{RESET^{**}}$ for the memory device 200 equals the following:

$$I_{RESET^{**}}=I_4=\sim V_{RESET}/(R_{CSE}+R_{220}+R_{230}) \text{ or } \sim V_{RESET}/(R_2+R_3+R_4)$$

Next, the "sensing" pulse 412, such as the pulse 406 in FIG. 4B, is often applied to assure that the logic "zero" state has been achieved, after delivering the "reset" switching pulse 413. If a "reset" operation was performed correctly, the current through the memory device 200 during this sensing step equals the $I_{OFF}$ current, which equals the $V_{READ}$ voltage divided by the sum of the impedance ($R_2$) of the current steering element 216, the impedance ($R_5$) of the variable resistance layer 206, and the impedance ($R_3$) of the current-limiting layer 220, and the impedance ($R_4$) of the current-reducing layer 230. Therefore, in one example, the $I_{OFF^{**}}$ current for the memory device 200 is as follows.

$$I_{OFF^{**}}=\sim V_{READ}/(R_2+R_3+R_4+R_5)$$

The integration of the current-limiting layer 220 and the current-reducing layer 230 in the memory device 200 reduces the voltage applied across the current steering element 216, and thus prevents the current steering element 216 from being damaged due to the application of a voltage near the breakdown state of the material layers and/or the degradation of the material layers over time due to damage created by the repetitive application of the programming voltages. One will note that, the actual impedance ($R_{CSE^{**}}$) of the current steering element 216 is generally greater than the impedance of a current steering element disposed in conventional current steering elements, since the added voltage drop of the current-limiting layer 220 and the current-reducing layer 230 in the device circuit will prevent the current steering element 216 from being damaged by the application of the programming currents during normal operations.

In one example, the total resistance of the current-limiting layer 220 and the current-reducing layer 230 is dependent on the thickness of the layers, device area, and geometry and other device specification requirements, and can be, for example, between about 10 kΩ and about 600 kΩ, such as between about 10 kΩ and about 200 kΩ. One will note that it is assumed that the contact resistances between the various layers in the memory device 220, such as the contact resistance formed between the electrode 102 and the variable resistance layer 206, are negligible to help reduce the complexity of the discussion of the circuit. While the current steering element 216 may include two or more layers of semiconductor material that are adapted to control the flow of current through the memory device 200, the resistance of each of the components in the current steering element 216 are not individually discussed herein to minimize the complexity of the discussion, and thus an overall current steering element resistance $R_{CSE}$ or $R_2$, for example, is used to represent the overall impedance of the current steering element 216. Other examples of controlling the resistance values of the various material layers in the formed resistive switching element 112 and the levels of current flowing through a memory device during resistive switching operations are found in a co-pending U.S. patent application Ser. No. 13/228,744, filed Sep. 9, 2011, and a continuation-in-part of co-pending U.S. patent application Ser. No. 13/353,000, filed Jan. 18, 2012, which claims benefit of U.S. provisional patent application Ser. No. 61/513,355, filed Jul. 29, 2011. The disclosure materials of these co-pending patent applications are hereby incorporated by reference in its entirety.

Figures 5A, 5B, 5C:
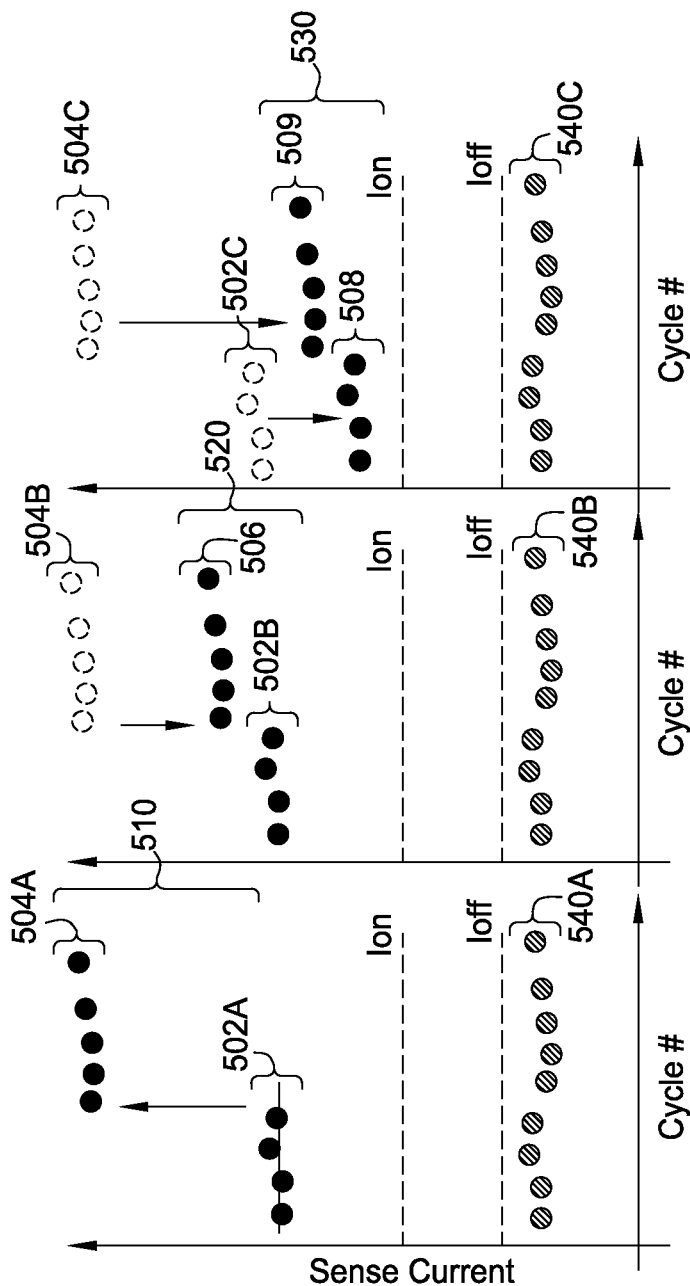
FIG. 5A illustrates the switching current levels of a conventional nonvolatile memory device in accordance with one embodiment of the invention.
FIG. 5B illustrates the switching current levels of a nonvolatile memory device having a current-limiting layer in accordance with another embodiment of the invention.
FIG. 5C illustrates the switching current levels of a nonvolatile memory device having a current-limiting layer and a current-reducing layer in accordance with another embodiment of the invention.

FIGS. 5A-5C demonstrated the results of the measured switching current levels among exemplary formed memory devices 200. In operation, "set" and "reset" programming operations are performed by cyclically applying "set" and "reset" switching pulses to a memory device 200. After each of the "set" and "reset" switching pulses are applied, a "sensing" pulse at a $V_{READ}$ voltage is generally used to assure that appropriate device logic "one" or "zero" states have been achieved and the current flowing through the memory device 200 at each sensing step would be close or equal to "$I_{ON}$" or "$I_{OFF}$", after each of the "set" or "reset" switching pulse, respectively.

In FIG. 5A, the measured currents of a conventional memory device during "set" and "reset" switching operations are plotted against the numbers of switching cycles, where each switching cycle represents cyclically applying a set pulse, a sensing pulse, a reset pulse, and another sensing pulse to the memory device. As illustrated in FIG. 5A, each solid black dot (e.g., sense current level 510) represents the current level measured by applying a "sensing" pulse (e.g., $V_{READ}$) after each "set" switching pulse has been applied to the conventional memory device. Each sense current level 540A, which is represented by a hatched dot, is the sense current level measured by applying a "sensing" pulse after each "reset" switching pulse has been applied to the conventional memory device. As shown in FIG. 5A, the sense current levels 540A are close to the desired $I_{OFF}$ levels.

However, as shown in FIG. 5A, it is observed that the measured sensing current levels at $V_{READ}$ after performing each "set" operation in a conventional memory device, as represented by the sense current levels 510, are considerably higher than needed (e.g., much higher than the desired $I_{ON}$ levels as shown in FIG. 5A). For example, in a conventional memory device, the sense current levels 510 measured after each device "set" operation vary to a large extent among themselves and, as measured, include sense current levels 502A and sense current levels 504A. In general, the high sensing currents created by a high current delivered during "set" operations completed in a conventional memory device, as shown by the sense current levels 502A and the sense current levels 504A, will likely cause device failure to the conventional memory device.

For example, the magnitudes of the sense current levels 502A are too far away from the desired $I_{ON}$ levels. What is worse is that, the "set" current levels of a conventional memory device may encounter a current spike, which may be created by the large currents flowing through the memory device during electrical-forming or switching operations when voltage pulses at high voltage levers or longer pulsing times are applied to the memory device. Once such a high current spike level is reached in a conventional memory device, the "set" current level cannot be adjusted back. The magnitudes of such current spikes, as represented by the sense current levels 504A, often exceed the device compliance current level, $I_{CC}$, and may damage the memory device. In addition, the clustering of the sense current levels 504A indicates that, once a conventional memory device is formed and has encountered such extremely high current spikes during the switching operations, there is no effective way to reduce the "set" current levels and the damage to the device may be permanent.

In FIG. 5B, in accordance with one embodiment of the invention, a nonvolatile memory device having the current-limiting layer 220 is formed and the current levels of the nonvolatile memory device having the current-limiting layer 220 are measured. Each solid black dot (e.g., sense current level 520) represents the current level measured by applying a "sensing" pulse (e.g., $V_{READ}$) after each "set" switching pulse has been applied to the memory device having the current-limiting layer 220. The sense current levels 520 include sense current levels 502B and sense current levels 506. Each sense current level 540B, which is represented by a hatched dot, is the sense current level measured by applying a "sensing" pulse after each "reset" switching pulse has been applied to the memory device having the current-limiting layer 220. The current levels (e.g., the sense current levels 540B in FIG. 5B) measured in the memory device having the current-limiting layer 220 after performing each "reset" operation are substantially the same as the current levels measured in a conventional memory device (e.g., the sense current levels 540A in FIG. 5A), because the current level at a device "Off" state is approaching its intrinsic leakage current.

As shown in FIG. 5B, the presence of the current-limiting layer 220 in the memory device limits the occurrences of high current spikes during "set" switching operations. For example, in FIG. 5B, the current levels in the memory device having the current-limiting layer 220 after performing each "set" operation are measured to the reduced levels (e.g., the sense current levels 506), as indicated by a shift from the blank dots at the high current spikes levels (e.g., the blank dots in sense current levels 504B in FIG. 5B, which correspond to the current spikes of the sense current levels 504A shown in FIG. 5A as discussed above) to the low current levels (e.g., the sense current levels 506 as shown in FIG. 5B) measured after performing each "set" operation.

However, in FIG. 5B, some portions (e.g., the sense current levels 502B) of the sense current levels 520 in the memory device having the current-limiting layer 220 after performing each "set" operation are measured to the same levels as the current levels measured in the conventional memory device (e.g., the sense current levels 502A in FIG. 5A), and thus, still having the same problem of being too far away from the desired $I_{ON}$ levels and likely causing device failure. Therefore, there is still a need to reduce the overall high magnitude of currents during "set" operations.

In FIG. 5C, to further solve the high current problems during the "set" operations, in accordance with one or more embodiments of the invention, a nonvolatile memory device, such as the memory device 200 having the current-limiting layer 220 and the current-reducing layer 230, is formed. In FIG. 5C, the Y-axis represents the sense current levels obtained by cyclically applying a set pulse, a sensing pulse, a reset pulse, and another sensing pulse to the memory device 200 having the current-limiting layer 220 and the current-reducing layer 230 disposed therein. The X-axis represents the numbers of switching cycles.

Each solid black dot (e.g., sense current levels 530) represents the current levels measured by applying a "sensing" pulse (e.g., $V_{READ}$) after each "set" switching pulse has been applied to the memory device 200 having the current-limiting layer 220 and the current-reducing layer 230. The sense current levels 530 include sense current levels 508 and measured sense current levels 509. Hatched dots (e.g., sense current levels 540C in FIG. 5C) represent the current levels measured by applying a "sensing" pulse after each "reset" switching pulse has been applied to the memory device 200 having the current-limiting layer 220 and the current-reducing layer 230. The sense current levels 540C measured in the memory device 200 in FIG. 5C are substantially the same as the sense current levels 540A in FIG. 5A, as the current level is reaching its intrinsic leakage current level at device "Off" state.

As shown in FIG. 5C, in accordance with one or more embodiments of the invention, the presence of the current-reducing layer 230 is compatible with the incorporation of the additional current-limiting layer 220, and together, the current-limiting layer 220 and the current-reducing layer 230 can effectively function to further reduce the current levels flowing through the memory device 200 and limit the damage to the formed memory device 200 due to the current spikes flowing through the circuit elements. For example, in FIG. 5C, the currents that flow through the memory device 200 having the current-limiting layer 220 and the current-reducing layer 230 after performing "set" switching operations are measured to the reduced levels (e.g., the sense current levels 508, 509), as indicated by a shift from the blank dots at the high current levels (e.g., sense current levels 502C, 504C, which correspond to the sense current levels 502A, 504A shown in FIG. 5A as discussed above) to the current levels (e.g., the sense current levels 508, 509 as shown in FIG. 5C) measured after performing the "set" operations in the memory device 200 having both the current-limiting layer 220 and the current-reducing layer 230.

EXAMPLES

In accordance with one or more embodiments of the invention, a process of forming the memory device 200 includes forming a resistive switching memory element 112 having an intermediate electrode layer 210 comprising an n-doped polysilicon layer, a variable resistance layer 206 that is about 50 Å thick and comprises hafnium oxide ($Hf_xO_y$), a current-reducing layer 230 that comprises aluminum doped hafnium oxide (doped $Hf_xO_y$) at a thickness of between about 5 Å thick about 20 Å thick with a resistivity of about 2 Ω-cm and a current-limiting layer 220 that comprises hafnium nitride ($Hf_xN_y$) at a thickness of between about 50 Å and 200 Å with a resistivity of between about 10 Ω-cm and an electrode 102 that comprises a layer of titanium nitride (TiN). After forming the memory device 200, optionally at least one thermal processing step is performed to activate the materials within layers and enhance adhesion between the layers.

In another example of a memory device 200, the resistive switching memory element 112 comprises: an intermediate electrode 210 comprising an n-doped polysilicon layer, a current-reducing layer 230 that comprises silicon oxide at a thickness of about 15 Å with a resistivity of about 1.5 Ω-cm and a variable resistance layer 206 that is about 50 Å thick and comprises hafnium oxide ($Hf_xO_y$), and a electrode 102B that comprises a layer of titanium nitride (TiN). After the resistive switching memory element 112 is formed, a current-limiting layer 220 that comprises between about 5 Å and 200 Å of silicon nitride ($Si_xN_y$) with a resistivity of about 5 Ω-cm, and an electrode 102A that comprises a layer of n-doped polysilicon layer are deposited. After forming the memory device 200, then at least one thermal processing step is performed.

In yet another example of a memory device 200, a resistive switching memory element 112 is formed that comprises: an intermediate electrode 210 comprising an n-doped polysilicon layer, a current-reducing layer 230 that comprises about 50 Å of silicon oxide with a resistivity of about 2 Ω-cm a variable resistance layer 206 that is about 50 Å thick and comprises hafnium oxide ($Hf_xO_y$), a current-limiting layer 220 that comprises between about 50 Å and 1000 Å of a silicon layer that is doped to a level of between about $10^{13}$ and about $10^{16}$ atoms/cm$^3$, and an electrode 102 that comprises a layer of titanium nitride (TiN). In one example, the current-limiting layer 220 comprises an n-type silicon layer that has a boron doping level of about $10^{13}$ to about $10^{16}$ atoms/cm$^3$. In another example, the current-limiting layer 220 comprises a p-type silicon layer that has a phosphorous doping level of about $10^{13}$ to about $10^{16}$ atoms/cm$^3$. After forming the memory device 200, then at least one thermal processing step is performed.

In another example of a memory device 200, a resistive switching memory element 112 is formed that comprises: an intermediate electrode 210 comprising an n-doped polysilicon layer, a current-reducing layer 230 that is about 50 Å thick and comprises silicon oxide, a variable resistance layer 206 that is about 50 Å thick and comprises hafnium oxide ($Hf_xO_y$), a current-limiting layer 220 that is between about 50 Å and 500 Å thick and comprises titanium nitride ($Ti_xN_y$), and an electrode 102 that comprises a layer of titanium nitride (TiN). After forming the memory device 200, then at least one thermal processing step is performed.

In another example of a process of forming the memory device 200, a resistive switching memory element 112 is formed that comprises: an intermediate electrode 210 comprising an n-doped polysilicon layer, a current-reducing layer 230 that is about 50 Å thick and comprises silicon oxide, a variable resistance layer 206 that is about 50 Å thick and comprises hafnium oxide ($Hf_xO_y$), a current-limiting layer 220 that is between about 50 Å and 500 Å thick and comprises a stoichiometric tantalum nitride (TaN), layer and an electrode 102 that comprises a layer of titanium nitride (TiN). After forming the memory device 200, then at least one thermal processing step is performed.

Exemplary deposition process for depositing the current-limiting layer 220 over the surface of the variable resistance layer 206, the intermediate electrode layer 210, the electrode 102B, the electrode 102B, the electrode 118B, or the electrode 118A include PVD, CVD, ALD or other similar process. In one embodiment, the current-limiting layer 220 is a metal nitride layer (e.g., $Hf_xN_y$, $Ta_xN_y$), a metal oxide layer (e.g., $Al_2O_3$, $ZrO_2$), or semiconductor layer (e.g., doped Si, $Si_xN_y$) that is formed by use of a PVD, CVD or ALD process. In one example, the current-limiting layer 220 may be formed to a thickness between about 50 Å and about 500 Å, and comprise a material such as Ta, Ti, Hf, or Si. In one example, the current-limiting layer 220 is formed using a PVD process that deposits a $Hf_xN_y$ layer at a deposition rate of between about 4 to 8 Å/minute using a pure hafnium target and maintaining the processing environment during the PVD deposition process to between about 1% and about 40% nitrogen ($N_2$) and the balance being argon (Ar) gas. It has been found that maintaining the nitrogen concentration in a PVD processing environment to a range between 10-15% nitrogen will create a layer that is highly resistive (e.g., $10^3$ to $10^5$ µΩ-cm), and maintaining the nitrogen concentration in a PVD processing environment to a concentration of greater than about 40% will form a dielectric layer. Therefore, one can adjust the layer thickness and resistivity to form a hafnium nitride layer containing the current-limiting layer 220 that has a desirable resistance. In one process example, the nitrogen concentration in the processing environment during deposition is controlled to form a hafnium nitride (HfN) layer that has a desirable resistivity within a range of about 1 µΩ-cm to about 500 µΩ-cm.

In another example of a process of forming the current-limiting layer 220, an ALD process using a tert-butylimido tris-diethylamido tantalum (TBTDET) or pentakis(dimethylamino)tantalum PDMAT precursor and ammonia ($NH_3$) at a temperature of about 150° C. to about 300° C. is used to form a TaN film of about 50 Å to about 500 Å thick. In one process example, the tantalum (Ta) to nitrogen (N) concentration is maintained at a ratio of about 1:1 to achieve a layer that has a resistivity of between about 1000 µΩ-cm and about 5000 µΩ-cm.

In another example of a process of forming the current-limiting layer 220, an ALD process using a tetrakis(dimethylamino) titanium (TDMAT) precursor and ammonia ($NH_3$) at a temperature of about 100° C. to about 300° C. is used to form a TiN film that is between about 50 Å and about 500 Å thick. In one process example, the titanium (Ti) to nitrogen (N) concentration is maintained at a ratio of about 1:1 to achieve a layer that has a resistivity of between about 1000 and about 5000 µΩ-cm.

In yet another example of a process of forming the current-limiting layer 220, an ALD process using a tetrakis(dimethylamino) hafnium (TDMAH) precursor and ammonia ($NH_3$) at a temperature of about 150° C. to about 300° C. is used to form a HfN film of about 50 Å to about 500 Å thick. It has been found that by maintaining the hafnium (Hf) to nitrogen (N) concentration during deposition at a ratio of about 1:1.3 a resistive switching having desirable switching properties can be achieved.

In yet another example of a process of forming the current-limiting layer 220, an ALD process using a tetrakis(dimethylamino) zirconium (TDMAZ) precursor and ammonia ($NH_3$) at a temperature of about 150° C. to about 300° C. is used to form a ZrN film of about 50 Å to about 500 Å thick. It has been found that by maintaining the zirconium (Zr) to nitrogen (N) concentration during deposition at a ratio of about 1:1.3 a resistive switching having desirable switching properties can be achieved.

Exemplary deposition process for depositing the current-reducing layer 230 over the surface of the variable resistance layer 206, the intermediate electrode layer 210, or the electrode 118B, or the electrode 118A include PVD, CVD, ALD, other plasma treatment process techniques, and/or chemical treatment solutions. In one example, the current-reducing layer 230 may be a metal oxide, such as zirconium oxide ($Zr_xO_y$) or aluminum oxide ($Al_xO_y$). The current-reducing layer 230 can be comprised of a material that has a greater band gap than that of the variable resistance layer 206. For instance, if the variable resistance layer 206 is $HfO_2$ with a band gap of approximately 5.7 eV, the current-reducing layer 230 may be chosen to be $Al_2O_3$ with a band gap of approximately 8.4 eV. For example, the current-reducing layer 230 can be fabricated on the surface of the intermediate electrode layer 210 where a native oxide layer was removed and an ALD deposition process is used to deposit conformal layers with atomic scale thickness control. For depositing a metal oxide (e.g., $Al_2O_3$, $ZrO_2$), ALD is a multistep self-limiting process that includes the use of two reagents: a metal precursor (e.g., trimethylaluminum (TMA), tetrakisethylmethylaminozirconium (TEMEZr)) and an oxidizer (e.g., oxygen, ozone, water). The metal precursor is first introduced into a processing chamber containing the substrate 201 having the intermediate electrode layer 210 and adsorbs on the surface of the intermediate electrode layer 210. Next, the oxidizer is introduced into the chamber and reacts with the adsorbed layer to form a deposited metal oxide layer. The process is repeated to form a number of successive layers that make up the completed current-reducing layer 230. The current-reducing layer 230 may be fabricated to a thickness between about 3 Å and about 10 Å. The processes may be performed at atmospheric or vacuum conditions at between about 200° C. and about 30° C. The current-reducing layer 230 increases the barrier height at the interface between the electrodes 102, 118 and the variable resistance layer 206. The increased barrier height reduces the magnitude of the current that flows through the memory device 200 due to increased energy required to move the carrier over or tunnel through the fabricated barrier so that the current is able to flow through the memory device 200, resulting in desirably lower switching current for the memory device 200.

In another example, the current-reducing layer 230 may be a doped metal oxide layer fabricated on the surface of the electrode 118, 118B, the intermediate electrode layer 210, or the variable resistance layer 206 using a deposition process, such as atomic layer deposition (ALD), plasma enhanced atomic layer deposition (PEALD), chemical vapor deposition (CVD), plasma enhanced chemical vapor deposition (PECVD), physical vapor deposition (PVD), or the like. For example, the current-reducing layer 230 may be formed into a portion of the variable resistance layer 206 deposited over the surface of the substrate 201 using a PVD, CVD or ALD deposition process. The variable resistance layer 206 may comprise a metal oxide layer, such as $Hf_xO_y$, $Ta_xO_y$, $Al_xO_y$, $La_xO_y$, $Y_xO_y$, $Dy_xO_y$, $Yb_xO_y$, and/or $Zr_xO_y$, formed to a thickness of between about 20 Å and about 100 Å, such as between about 30 Å and about 50 Å. The variable resistance layer 206 can be deposited using any desired technique, but in some embodiments described herein is deposited using an ALD process. In one example, an ALD process using tetrakis(dimethylamino)hafnium (TDMAH) and an oxygen containing precursor (e.g., water vapor) at a temperature of about 250° C. is used to form a 30 Å thick hafnium oxide ($Hf_xO_y$) which acts as the variable resistance layer 206 and a dopant, such as aluminum or zirconium is delivered in to the ALD process chamber prior to or after the desired thickness of the variable resistance layer 206 is obtained to additionally form a layer of aluminum (Al) or zirconium (Zr) doped hafnium oxide ($Hf_xO_y$)-containing current reducing layer 230.

In still another example, the current-reducing layer 230 is a layer of high-k material fabricated on the surface of an electrode (e.g., the electrode 118, 118B, or the intermediate electrode layer 210) prior to fabricating the variable resistance layer 206. Examples of suitable high-k materials include aluminum oxide ($Al_2O_3$), zirconium oxide ($ZrO_2$), yttrium oxide ($Y_2O_3$), silicon nitride ($Si_3N_4$), silicon oxynitride (SiON), and the like. The presence of the high-k interfacial current-reducing layer 230 naturally forms a barrier height ($q\phi$) at the intermediate electrode 210. The size of the barrier height ($q\phi$) is strongly dependent on the bandgap of the material used to form the current-reducing layer 230. Thus, providing a suitable high-k material at the current-reducing layer 230 increases the barrier height (e.g., increase of 1 eV to 5 eV compared to native silicon oxide) at the interface between the intermediate electrode 210 and the variable resistance layer 206 due to the increased bandgap of the current-reducing layer 230, which lowers the magnitude of current (e.g., $I_{ON}$, $I_{OFF}$) that can flow through the device during operation, resulting in desirably lower switching current of the device 200. Providing a suitable high-k material as the current-reducing layer 230 also reduces the equivalent oxide thickness (EOT) of the dielectric layer stack fabricated in the device 200, allowing thinner layers to be used which results in desirably lower switching current and voltage.

In still another example, the current-reducing layer 230 may be a native oxide or silicide layer formed between the variable resistance layer 206 and an electrode (e.g., the electrodes 118, 102, 118B, 102B, or the intermediate electrode layer 210). The native oxide layer can be formed by cleaning the substrate surface with a substrate cleaning solution, such as a solution of hydrogen fluoride (HF) and deionized (DI) water. The cleaning solution may be an aqueous solution that contains between about 0.1% and about 10% weight of hydrogen fluoride (HF) that is maintained at a temperature between about 20° C. and about 3° C.

In yet another example, the current-reducing layer 230 is a layer of high quality silicon oxide fabricated over the surface of the substrate 201, such as over the surface of the variable resistance layer 206, the intermediate electrode layer 210, the electrode 102, the electrode 102B, the electrode 118B, or the electrode 118. Optionally, the surface of the substrate is cleaned with a substrate cleaning solution and the native oxide material is removed using a buffered oxide etch (BOE), such as a mixture of ammonium fluoride ($NH_4F$) and hydrofluoric acid (HF) prior to subjecting the substrate 201 with an ozone treatment or nitridation treatment. The current-reducing layer 230 is fabricated by intentionally fabricating a high quality silicon oxide layer over the surface of the substrate 201. In one embodiment, the silicon oxide layer is fabricated by performing an ozone treatment on a native oxide layer formed naturally over a cleaned surface of the substrate 201. In another embodiment, the silicon oxide containing current-reducing layer is fabricated by performing an ozone treatment on the surface of a material layer (e.g., the surface of the variable resistance layer 206, the intermediate electrode layer 210, the electrode 102, the electrode 102B, the electrode 118B, or the electrode 118). The ozone treatment provides a denser, higher quality layer of silicon oxide than a native silicon oxide layer naturally formed on the surface of the substrate 201, resulting in desirably lower switching current of the device 200. The ozone treatment may be a plasma process performed at between about 200° C. and about 30° C. Ozone may be flown into a plasma chamber at between about 500 sccm and about 1000 sccm from about 30 seconds to about 10 minutes during the ozone treatment. The ozone exposure may be continuous or pulsed. In another embodiment, the current-reducing layer 230 is formed by performing a nitridation process on the native oxide layer as a silicon oxynitride (SiON) material layer. In one example, a partially fabricated memory device 200 having a native oxide material layer on its surface is annealed in a nitrogen environment, such as $NH_3$, $N_2O$, NO, or the like. In this example, the partially fabricated memory device 200 is heated to a temperature between about 750° C. and about 900° C. at a pressure of less than about 100 Torr for a time period between about 30 second and about 120 seconds. In another example, the SiON-containing current reducing layer 230 is formed by plasma nitridation of a native oxide layer. In this example, the partially formed memory device 200 is exposed to plasma comprising a nitrogen source, such as nitrogen gas ($N_2$), $NH_3$, or combinations thereof. The plasma may further include an inert gas, such as helium, argon, or combinations thereof. The pressure in the chamber during the plasma exposure may be between about 1 mTorr and about 30 mTorr, and the temperature may be may be maintained at between about 200° C. and about 50° C.

In another embodiment, the silicon oxide containing current-reducing layer is fabricated by using chemical treatment. In this embodiment, a chemical oxidation solution, such as a mixture of ammonium hydroxide ($NH_4OH$), hydrogen peroxide ($H_2O_2$), and de-ionized (DI) water (hereafter, the APX mixture) is used to chemically treat the surface of a material layer (e.g., the surface of the variable resistance layer 206, the intermediate electrode layer 210, the electrode 102, the electrode 102B, the electrode 118B, or the electrode 118) and form a thin layer of good quality silicon oxide film. The ratio of $NH_4OH$ to $H_2O_2$ to DI water in the APX mixture may be from about 1:1:5 to about 1:1:50. For example, the surface of the intermediate electrode layer 210 may be exposed to the APX mixture at a temperature between about 25° C. and about 75° C. Following the chemical oxidation treatment, the surface of the substrate 201 may be exposed to a dilute hydrochloric acid (HCl), such as 1:100 HCl to DI water.

The ozone treatment or chemical oxidation treatment provides a denser, higher quality layer of silicon oxide than the native silicon oxide naturally formed over a surface of a cleaned substrate, resulting in desirably lower switching current of the device 200. In one embodiment, the above described nitridation process may be performed after the ozone or chemical treatment.

Accordingly, the current-reducing layer 230 may be an intentionally fabricated silicon oxide-containing layer designed to provide a number of beneficial characteristics at the interface between the variable resistance layer 206 and an electrode (e.g., the electrodes 118, 102, 118B, 102B, or the intermediate electrode layer 210) as compared to a native oxide layer formed naturally after cleaning a surface of a silicon-containing material layer. The current-reducing layer 230 also provides additional benefits, such as passivation at the surface of an electrode. In a conventionally fabricated memory device, the interface region formed between the electrodes and the variable resistance layer 206 generally contains many defects that can increase carrier recombination and prevent a good electrical contact from being formed between these fabricated adjacent layers. In general, the amount of carrier recombination is a function of how many dangling bonds (i.e., unterminated chemical bonds) are present at the interface. These unterminated chemical bonds act as defect traps, which can act as sites for carrier recombination and increase the resistance to the flow of the "on" and "off" currents through the fabricated device, resulting in the high sense current levels 510, as shown in FIG. 5A. Therefore, in one embodiment of the invention, a passivation current-reducing layer 230 is fabricated at the interface between an electrode and the variable resistance layer 206 to passivate the defects found at the interface of the electrode 210 and the variable resistance layer 206. Since the number of defects can vary from one fabricated memory device to the next, and from one region of the substrate on which the device is fabricated to another, the variability of the device performance can vary from device to device, and from one region of the substrate to another. Therefore, by fabricating the current-reducing layer 230 adjacent the variable resistance layer 206, which reduces the number of interfacial defects and passivates the interface surface, the device performance variability across a fabricated integrated circuit structure (e.g., array of fabricated devices) can be greatly reduced. In addition, better data retention can be achieved through passivating the interface of the electrodes and the variable resistance layer 206. In this sense, passivation of the interface prevents trapping of charged species during switching of the variable resistance layer 206, which prevents degradation of switching current and voltage during bistable switching operations of the variable resistance layer 206.

In addition, the current-reducing layer 230 provides an improved diffusion barrier between the electrodes and the variable resistance layer 206. For example, during formation of the variable resistance layer 206 (e.g., $HfO_2$), oxygen atoms may diffuse into the surface of the electrode (e.g., polysilicon) and form a low quality silicon oxide layer, which may hinder the flow of current into the variable resistance layer 206 resulting in elevated forming and/or switching currents and voltages. The addition of the current-reducing layer 230 provides a diffusion barrier between the electrodes and the variable resistance layer 206, resulting in a higher quality interface between the two layers, and thus improved electrical properties.

The foregoing is merely illustrative of the principles of this invention and various modifications can be made by those skilled in the art without departing from the scope and spirit of the invention as defined by the claims that follow.

The invention claimed is:

1. A memory device, comprising:
   a nonvolatile memory element having a first electrode layer, a second electrode layer, and a variable resistance layer disposed between the first electrode layer and the second electrode layer,
   a current-reducing layer formed as a portion of the variable resistance layer; and
   a current-limiting layer disposed between the variable resistance layer and one of the first electrode layer and the second electrode layer, wherein the current-limiting layer has a breakdown voltage that exceeds a breakdown voltage of the variable resistance layer.

2. The memory device of claim 1, further comprising a current-steering element coupled to the variable resistance layer and having a first electrical resistance, wherein a resistivity of the current-limiting layer is adjusted such that an electrical resistance of the current-limiting layer is between about 75% and about 125% of the first electrical resistance of the current steering element when current is flowing from the first electrode layer to the second electrode layer.

3. The memory device of claim 1, further comprising a current-steering element coupled to the variable resistance layer, wherein a thickness of the current-limiting layer is adjusted such that an electrical resistance of the current-limiting layer is between about 75% and about 125% of the electrical resistance of the current steering element when current is flowing from the first electrode to the second electrode.

4. The memory device of claim 1, wherein the current-limiting layer comprises a resistive material selected from the group consisting of polysilicon, doped semiconductor materials, dielectric materials, metal nitrides, tantalum-containing materials, titanium-containing materials, silicon nitride, tantalum nitride, titanium nitride, hafnium nitride, germanium (Ge)-containing materials, gallium arsenide, and combinations thereof.

5. The memory device of claim 1, wherein the current-reducing layer comprises a doped hafnium oxide material formed by adding a dopant, selected from the group consisting of aluminum and zirconium, into a portion of the variable resistance layer.

6. The memory device of claim 1, wherein the current-reducing layer comprises a silicon oxide-containing layer formed by chemically treating the variable resistance layer with a chemical oxidation solution after the formation of the variable resistance layer.

7. The memory device of claim 1, wherein the current-reducing layer comprises a silicon oxide-containing layer formed by chemically treating the variable resistance layer with a buffered cleaning solution after the formation of the variable resistance layer.

8. The memory device of claim 7, wherein the current-reducing layer comprises a silicon oxide-containing layer formed by treating a portion or the bulk of the variable resistance layer with a plasma selected from the group consisting of an ozone-containing plasma and a nitrogen-containing plasma after the formation of the variable resistance layer.

9. The memory device of claim 1, wherein the current-reducing layer comprises a high-k material layer between the variable resistance layer and the one of the first and the second electrode layers.

10. The memory device of claim 9, wherein the high-k material layer comprises a material selected from the group consisting of aluminum oxide, zirconium oxide, silicon oxynitride, and combinations thereof.

11. A memory device, comprising:
    a nonvolatile memory element having a first electrode layer, a second electrode layer, and a variable resistance layer disposed between the first electrode layer and the second electrode layer;
    a current-reducing layer formed into a portion of the variable resistance layer, wherein the variable resistance layer comprises a metal oxide material and the current-reducing layer comprises the metal oxide material and a dopant material disposed within at least a portion of the metal oxide material; and
    a current-limiting layer disposed between the variable resistance layer and one of the first electrode layer and the second electrode layer,
    wherein the current-limiting layer has a breakdown voltage that exceeds a breakdown voltage of the variable resistance layer.

12. The memory device of claim 11, wherein the dopant material is a material selected from the group consisting of aluminum, zirconium, and combinations thereof.

13. A method of forming a nonvolatile memory device, comprising:
    depositing a first electrode layer, a second electrode layer, and a variable resistance layer between the first electrode layer and the second electrode layer over a surface of a substrate;
    forming a current-reducing layer as a part of the variable resistance layer; and
    depositing a current-limiting layer between the variable resistance layer and at least one of the first electrode layer and the second electrode layer,
    wherein the current-limiting layer has a breakdown voltage that exceeds a breakdown voltage of the variable resistance layer.

14. The method of claim 13, further comprising:
    forming a current-steering element coupled to the variable resistance layer, wherein the current steering element has a first electrical resistance; and
    adjusting a resistivity of the current-limiting layer such that an electrical resistance of the current-limiting layer is between about 75% and about 125% of the first electrical resistance of the current steering element when current is flowing from the first electrode layer to the second electrode layer.

15. The method of claim 13, wherein the current-reducing layer comprises a silicon oxide-material.

16. A method of forming a nonvolatile memory device having a nonvolatile memory element, comprising:
    depositing a first electrode layer, a second electrode layer, and a variable resistance layer between the first electrode layer and the second electrode layer over a surface of a substrate;
    forming a current-reducing layer into a portion of the variable resistance layer by adding a dopant during the deposition of the variable resistance layer; and
    depositing a current-limiting layer between the variable resistance layer and at least one of the first electrode layer and the second electrode layer,
    wherein the current-limiting layer has a breakdown voltage that exceeds a breakdown voltage of the variable resistance layer.

17. The method of claim 16, wherein the dopant is a material selected from the group consisting of aluminum, zirconium, and combinations thereof.

* * * * *

UNITED STATES PATENT AND TRADEMARK OFFICE
CERTIFICATE OF CORRECTION

PATENT NO. : 8,866,121 B2  
APPLICATION NO. : 13/399530  
DATED : October 21, 2014  
INVENTOR(S) : Wang et al.

It is certified that error appears in the above-identified patent and that said Letters Patent is hereby corrected as shown below:

On the Title Page, Item (56)

Page 3, References Cited, Other Publications, Column 1, line 50, please change "Pisacataway" to --Piscataway--.

Page 3, References Cited, Other Publications, please insert --Response to Office Action filed July 2, 2014 in U.S. Patent Application No. 14/176,882--.

Signed and Sealed this
Twenty-sixth Day of May, 2015

Michelle K. Lee
*Director of the United States Patent and Trademark Office*